US012787296B2

(12) United States Patent
Lee et al.

(10) Patent No.: US 12,787,296 B2
(45) Date of Patent: Nov. 3, 2026

(54) SEMICONDUCTOR DEVICE

(71) Applicant: SAMSUNG ELECTRONICS CO., LTD., Suwon-si (KR)

(72) Inventors: Jeonil Lee, Suwon-si (KR); Kyunghwan Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 331 days.

(21) Appl. No.: 18/368,067

(22) Filed: Sep. 14, 2023

(65) Prior Publication Data

US 2024/0099015 A1 Mar. 21, 2024

(30) Foreign Application Priority Data

Sep. 15, 2022 (KR) ........................ 10-2022-0116565

(51) Int. Cl.

| | |
|---|---|
| ***H10B 51/20*** | (2023.01) |
| ***H10B 80/00*** | (2026.01) |
| ***H10W 72/90*** | (2026.01) |
| ***H10W 90/00*** | (2026.01) |

(52) U.S. Cl.

CPC ............. *H10B 51/20* (2023.02); *H10B 80/00* (2023.02); *H10W 72/952* (2026.01); *H10W 90/00* (2026.01); *H10W 90/792* (2026.01)

(58) Field of Classification Search

CPC ..... H10B 51/20; H10B 80/00; H10W 72/952; H10W 90/00; H10W 90/792

See application file for complete search history.

(56) References Cited

U.S. PATENT DOCUMENTS

| | | | | |
|---|---|---|---|---|
| 10,734,409 | B2 | 8/2020 | Yoo | |
| 10,777,578 | B2 | 9/2020 | Liu | |
| 10,916,654 | B2 | 2/2021 | Fujii | |
| 10,978,485 | B2 * | 4/2021 | Lue | G11C 11/1659 |
| 11,171,157 | B1 | 11/2021 | Lai et al. | |
| 2019/0139983 | A1 * | 5/2019 | Lee | H10B 41/27 |
| 2019/0312052 | A1 * | 10/2019 | Lee | H10B 43/10 |
| 2020/0303410 | A1 * | 9/2020 | Kanamori | G11C 16/08 |

(Continued)

FOREIGN PATENT DOCUMENTS

KR 10-2022-0000793 A 1/2022

OTHER PUBLICATIONS

Office Action dated Sep. 29, 2026 issued in corresponding to Korean Patent Application No. 10-2022-0116565.

*Primary Examiner* — Richard A Booth

(74) *Attorney, Agent, or Firm* — Morgan, Lewis & Bockius LLP

(57) ABSTRACT

A semiconductor device includes a substrate. A plurality of horizontal structures is stacked on the substrate and spaced apart from each other. A plurality of vertical structures penetrates through the plurality of horizontal structures. Each of the plurality of vertical structures includes a vertical source line, a vertical bit line, a channel layer, and a dielectric layer. The channel layer is in direct contact with the vertical source line and the vertical bit line. The dielectric layer is disposed between the plurality of horizontal structures and the channel layer. Each of the plurality of horizontal structures includes a first conductive layer, a ferroelectric layer surrounding at least a portion of the first conductive layer, and a second conductive layer disposed between the ferroelectric layer and the dielectric layer.

20 Claims, 18 Drawing Sheets

100B

A-A'

(56) References Cited

U.S. PATENT DOCUMENTS

| | | | | |
|---|---|---|---|---|
| 2020/0395412 | A1* | 12/2020 | Lee | H10N 70/881 |
| 2021/0082957 | A1 | 3/2021 | Sakuma et al. | |
| 2021/0399017 | A1 | 12/2021 | Sun et al. | |
| 2021/0408045 | A1 | 12/2021 | Chiang et al. | |
| 2022/0130862 | A1 | 4/2022 | Lue | |

* cited by examiner

A–A'

A-A'

A-A'

SEMICONDUCTOR DEVICE

CROSS-REFERENCE TO RELATED APPLICATION(S)

This application claims priority under 35 USC 119 to Korean Patent Application No. 10-2022-0116565, filed on Sep. 15, 2022 in the Korean Intellectual Property Office, the disclosure of which is incorporated by reference in its entirety herein.

1. TECHNICAL FIELD

The present inventive concept relates to a semiconductor device.

2. DISCUSSION OF RELATED ART

Research is being conducted to develop a device that can replace a dynamic random access memory (DRAM) and a flash memory. For example, a ferroelectric device is being researched as a non-volatile and high-speed random access memory (RAM).

SUMMARY

An embodiment of the present inventive concept provides a semiconductor device with increased electrical properties.

According to an embodiment of the present inventive concept, a semiconductor device includes a substrate. A plurality of horizontal structures is stacked on the substrate and spaced apart from each other. A plurality of vertical structures penetrates through the plurality of horizontal structures. Each of the plurality of vertical structures includes a vertical source line, a vertical bit line, a channel layer, and a dielectric layer. The channel layer is in direct contact with the vertical source line and the vertical bit line. The dielectric layer is disposed between the plurality of horizontal structures and the channel layer. Each of the plurality of horizontal structures includes a first conductive layer, a ferroelectric layer surrounding at least a portion of the first conductive layer, and a second conductive layer disposed between the ferroelectric layer and the dielectric layer.

According to an embodiment of the present inventive concept, a semiconductor device includes a substrate. A plurality of horizontal structures is stacked on the substrate and is spaced apart from each other in a vertical direction. A plurality of vertical structures penetrates through the plurality of horizontal structures. Each of the plurality of vertical structures includes a vertical conductive line overlapping the plurality of horizontal structures in a horizontal direction, a channel layer on a side surface of the vertical conductive line, and a dielectric layer on a side surface of the channel layer. Each of the plurality of horizontal structures includes a first conductive layer, a ferroelectric layer surrounding at least a portion of the first conductive layer, and a second conductive layer between the ferroelectric layer and the dielectric layer. An upper surface of the second conductive layer is coplanar with an upper surface of the ferroelectric layer in the vertical direction.

According to an embodiment of the present inventive concept, a semiconductor device includes a substrate. A plurality of horizontal structures is stacked on the substrate and is spaced apart from each other. A plurality of vertical structures penetrates through the plurality of horizontal structures. Each of the plurality of vertical structures includes a vertical conductive line overlapping the plurality of horizontal structures in a horizontal direction, a channel layer on a side surface of the vertical conductive line, and a dielectric layer on a side surface of the channel layer. Each of the plurality of horizontal structures includes a first conductive layer, a ferroelectric layer surrounding at least a portion of the first conductive layer, and a second conductive layer surrounding at least a portion of the ferroelectric layer.

BRIEF DESCRIPTION OF DRAWINGS

The above and other aspects, features, and advantages of embodiments of the present inventive concept will be more clearly understood from the following detailed description, taken in conjunction with the accompanying drawings, in which.

DETAILED DESCRIPTION OF EMBODIMENTS

Hereinafter, embodiments of the present inventive concept will be described with reference to the accompanying drawings.

Figure 1A:
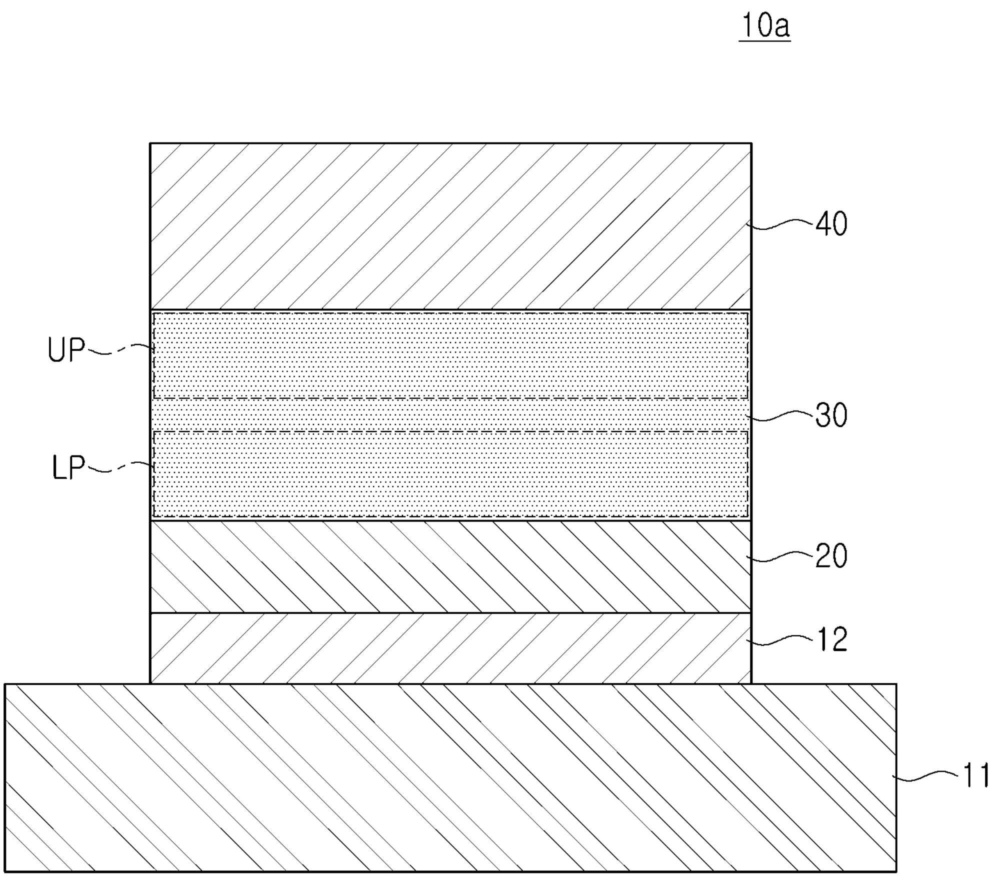
FIG. 1A is a schematic cross-sectional view of a ferroelectric device according to an embodiment of the present inventive concept.

FIG. 1A is a schematic cross-sectional view of a ferroelectric device according to an embodiment of the present inventive concept.

Referring to FIG. 1A, a ferroelectric device 10*a* may include a channel layer 11, a dielectric layer 12 on the channel layer 11, a lower conductive layer 20 on the dielectric layer 12, a ferroelectric layer 30 on the lower conductive layer 20, and an upper conductive layer 40 on the ferroelectric layer 30. A crystalline phase of an orthorhombic phase (e.g., an O phase) may be formed more easily in a lower region LP of the ferroelectric layer 30 adjacent to the lower conductive layer 20 and an upper region UP of the ferroelectric layer 30 adjacent to the upper conductive layer 40 by disposing the ferroelectric layer 30 between the lower conductive layer and the upper conductive layer 40. Accordingly, the ferroelectric device may have an increased memory window.

The channel layer 11 may include a material that may be used as a channel of a transistor, for example, a semiconductor material. For example, in an embodiment the channel layer 11 may be formed of a semiconductor material such as silicon. The channel layer 11 may be formed of single crystal silicon or polysilicon. However, embodiments of the present inventive concept are not necessarily limited thereto and the channel layer 11 may be formed of another semiconductor material that may be used as a channel region of a transistor in some embodiments. For example, the channel layer 11 may include an oxide semiconductor layer that may be used as the channel region of a transistor or a two-dimensional material layer having a semiconductor characteristic.

In an embodiment, the oxide semiconductor layer may include at least one of indium gallium zinc oxide (IGZO), indium tungsten oxide (IWO), indium tin gallium oxide (ITGO), indium aluminum zinc oxide (IAGO), indium gallium oxide (IGO), indium tin zinc oxide (ITZO), zinc tin oxide (ZTO), indium zinc oxide (IZO), zinc oxide (ZnO), indium gallium silicon oxide (IGSO), indium oxide (InO), tin oxide (SnO), titanium oxide (TiO), zinc oxynitride (ZnON), magnesium zinc oxide (MgZnO), indium zinc oxide (InZnO), indium gallium zinc oxide (InGaZnO), zirconium indium zinc oxide (ZrInZnO), hafnium indium zinc oxide (HfInZnO), tin Indium zinc oxide (SnInZnO), aluminum tin indium zinc oxide (AlSnInZnO), silicon indium zinc oxide (SiInZnO), zinc tin oxide (ZnSnO), aluminum zinc tin oxide (AlZnSnO), gallium zinc tin oxide (GaZnSnO), zirconium zinc tin oxide (ZrZnSnO), and Indium gallium silicon oxide (InGaSiO). The two-dimensional material layer having the semiconductor characteristic may include at least one of a transition metal dichalcogenide material layer (TMD) material layer and a black phosphorous material layer.

In an embodiment, the dielectric layer 12 may include at least one of silicon oxide, silicon oxynitride, silicon nitride, and a high-k dielectric. The high-k dielectric may include metal oxide or metal oxynitride. For example, the high dielectric may be formed of hafnium oxide ($HfO_2$), hafnium silicon oxide (HfSiO), hafnium silicon oxynitride (HfSiON), hafnium tantalite HfTaO, hafnium titanate (HfTO), hafnium zirconium oxide (HfZrO), Zirconium dioxide ($ZrO_2$), alumina ($Al_2O_3$), or a combination thereof. However, embodiments of the present inventive concept are not necessarily limited thereto.

In an embodiment, the lower conductive layer 20 and the upper conductive layer 40 may each include doped polysilicon, metal, conductive metal nitride, metal-semiconductor compound, conductive metal oxide, conductive graphene, and carbon nanotubes, or a combination thereof. For example, the lower conductive layer 20 and the upper conductive layer 40 may each be formed of doped polysilicon, aluminum (Al), copper (Cu), titanium (Ti), tantalum (Ta), ruthenium (Ru), tungsten (W), molybdenum (Mo), platinum (Pt), nickel (Ni), cobalt (Co), titanium nitride (TiN), tantalum nitride (TaN), tungsten nitride (WN), niobium nitride (NbN), Titanium Aluminum (TAl), Titanium aluminium nitride (TiAlN), titanium silicide (TiSi), titanium silicide nitride (TiSiN), tantalum silicate (TaSi), titanium silicon nitride (TiSiN), ruthenium titanium nitride (RuTiN), nickel-silicide (NiSi), cobalt monosilicide (CoSi), iridium oxide ($IrO_x$), ruthenium oxide ($RuO_x$), graphene, carbon nanotube, or a combination thereof. However, embodiments of the present inventive concept are not necessarily limited thereto. The lower conductive layer 20 and the upper conductive layer 40 may each include a single layer or multiple layers of the aforementioned materials.

The ferroelectric layer 30 may be formed of a ferroelectric material. The ferroelectric layer 30 may have a polarization characteristic according to an electric field applied by the upper conductive layer 40, and may have residual polarization due to dipoles even in the absence of an external electric field. Data may be stored by using the polarization state of the ferroelectric layer 30.

In an embodiment, the ferroelectric layer 30 may be a ferroelectric including at least one of a hafnium (Hf)-based compound, a zirconium (Zr)-based compound, and a hafnium zirconium (Hf—Zr)-based compound. For example, the Hf-based compound may be a hafnium oxide (Hfn)-based ferroelectric material, the Zr-based compound may include a zirconium oxide (ZrO)-based ferroelectric material, and the Hf—Zr-based compound may be a hafnium zirconium oxide (HZO)-based ferroelectric material.

The ferroelectric layer 30 may be a ferroelectric material doped with impurities such as carbon (C), silicon (Si), magnesium (Mg), aluminum (Al), yttrium (Y), nitrogen (N), or germanium (Ge), and at least one of tin (Sn), gadolinium (Gd), lanthanum (La), scandium (Sc), and strontium (Sr). The ferroelectric layer 30 may be a ferroelectric material in which at least one of $HfO_2$, $ZrO_2$ and HZO is doped with the impurities such as carbon (C), silicon (Si), magnesium (Mg), aluminum (Al), yttrium (Y), nitrogen (N), germanium (Ge), and at least one of tin (Sn), gadolinium (Gd), lanthanum (La), scandium (Sc), and strontium (Sr).

However, embodiments of the present inventive concept are not necessarily limited thereto and the ferroelectric layer 30 may include another material having a ferroelectric property capable of storing information. For example, in an embodiment the ferroelectric layer 30 may be a ferroelectric including at least one of $BaTiO_3$, $PbTiO_3$, BiFeOz, $SrTiO_3$, $PbMgNdO_3$, $PbMgNbTiO_3$, $PbZrNbTiO_3$, $PbZrTiO_3$, $KNbO_3$, $LiNbO_3$, GeTe, $LiTaO_3$, $KNaNbO_3$, $BaSrTiO_3$, $HF_{0.5}Zr_{0.5}$ $O_2$, $PbZrxTi_{1-x}O_3$ ($0<x<1$), $Ba(Sr,Ti)O_3$, $Bi_{4-x}La_xTi_3O_{12}$ ($0<x<1$), $SrBi_2Ta_2O_9$, $Pb_5Ge_5O_{11}$, $SrBi_2Nb_2O_9$, and $YMnO_3$.

Figure 1B:
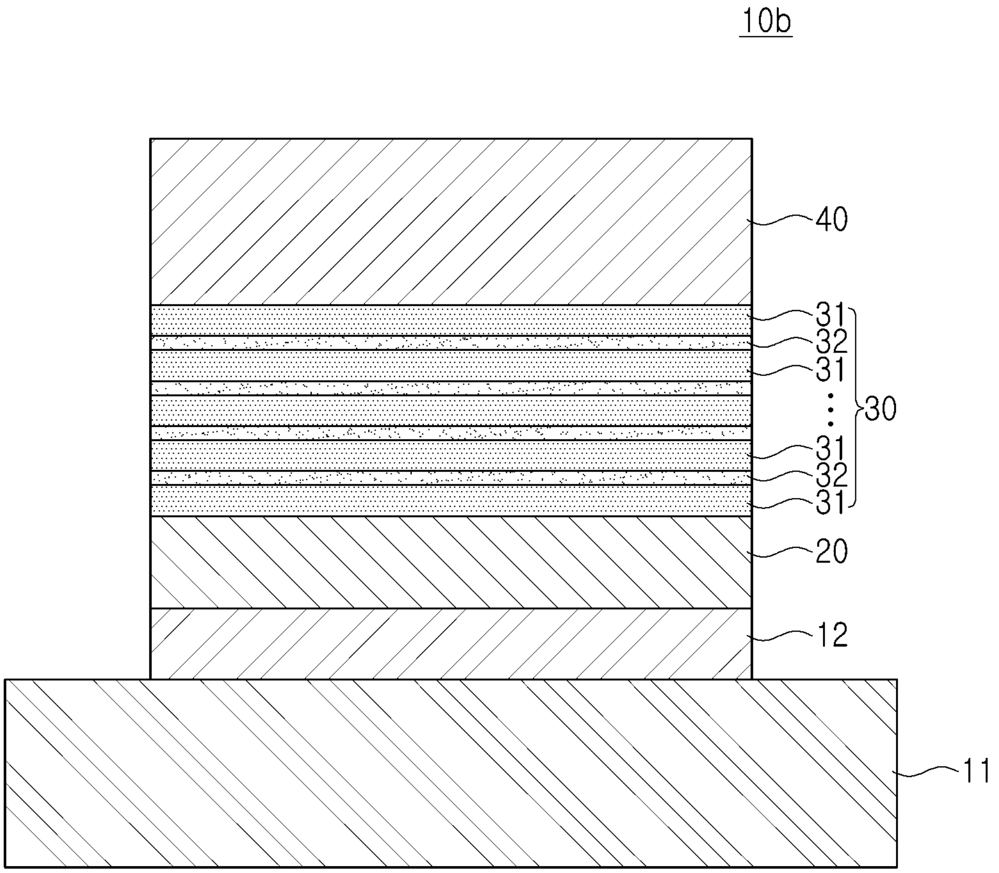
FIG. 1B is a schematic cross-sectional view of a ferroelectric device according to an embodiment of the present inventive concept.

FIG. 1B is a schematic cross-sectional view of a ferroelectric device according to an embodiment of the present inventive concept.

Referring to FIG. 1B, the ferroelectric layer 30 of a ferroelectric device 10*b* may have a structure in which a plurality of layers are laminated. For example, the ferroelectric layer 30 may have a structure in which a plurality of first layers 31 and a plurality of second layers 32 are alternately laminated on each other (e.g., in a Z-direction which is a thickness direction of the semiconductor device 100A). For example, in an embodiment the first layer 31 may include a material having the aforementioned ferroelectric property, and the second layer 32 may include an insulating material such as silicon oxide, silicon oxynitride, or silicon nitride. For example, the first layer 31 and the second layer 32 may include ferroelectric materials different from each other among the materials having the aforementioned ferroelectric properties. The polarization of the ferroelectric layer 30 may be increased and the memory window may be increased, by a structure of the ferroelectric layer 30 in which the plurality of layers are laminated.

Figure 2:
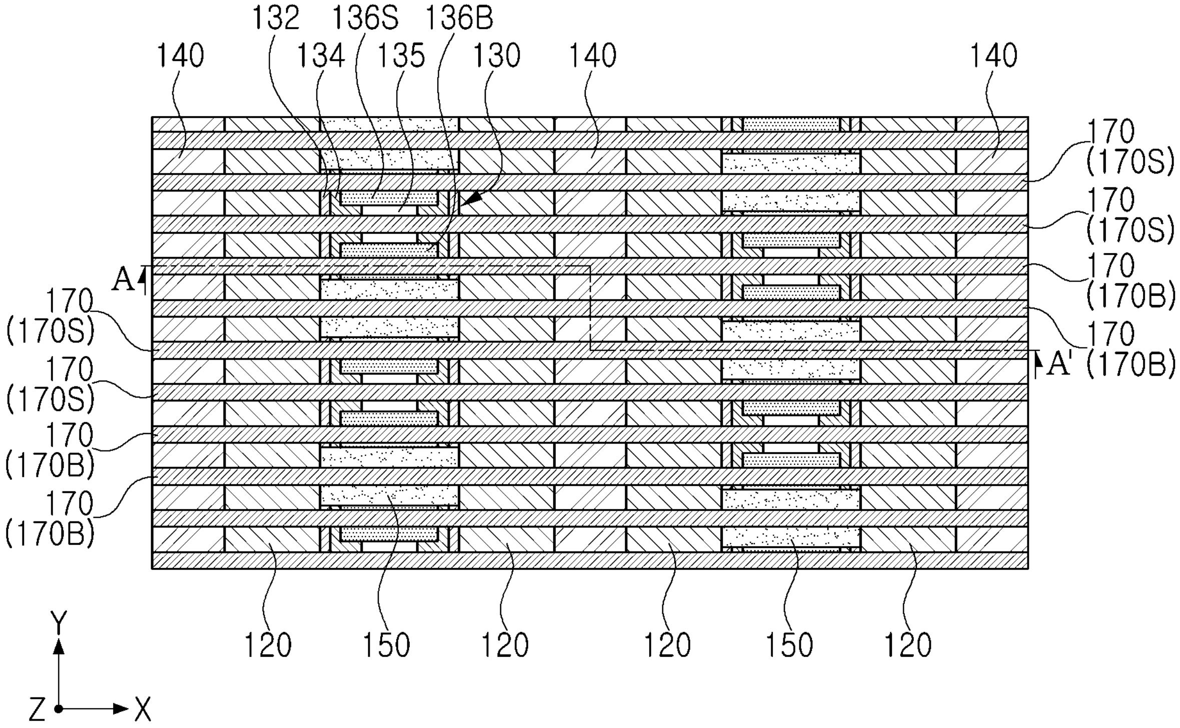
FIG. 2 is a schematic plan view of a semiconductor device according to an embodiment of the present inventive concept.

FIG. 2 is a schematic plan view of a semiconductor device according to an embodiment of the present inventive concept.

Figure 3:
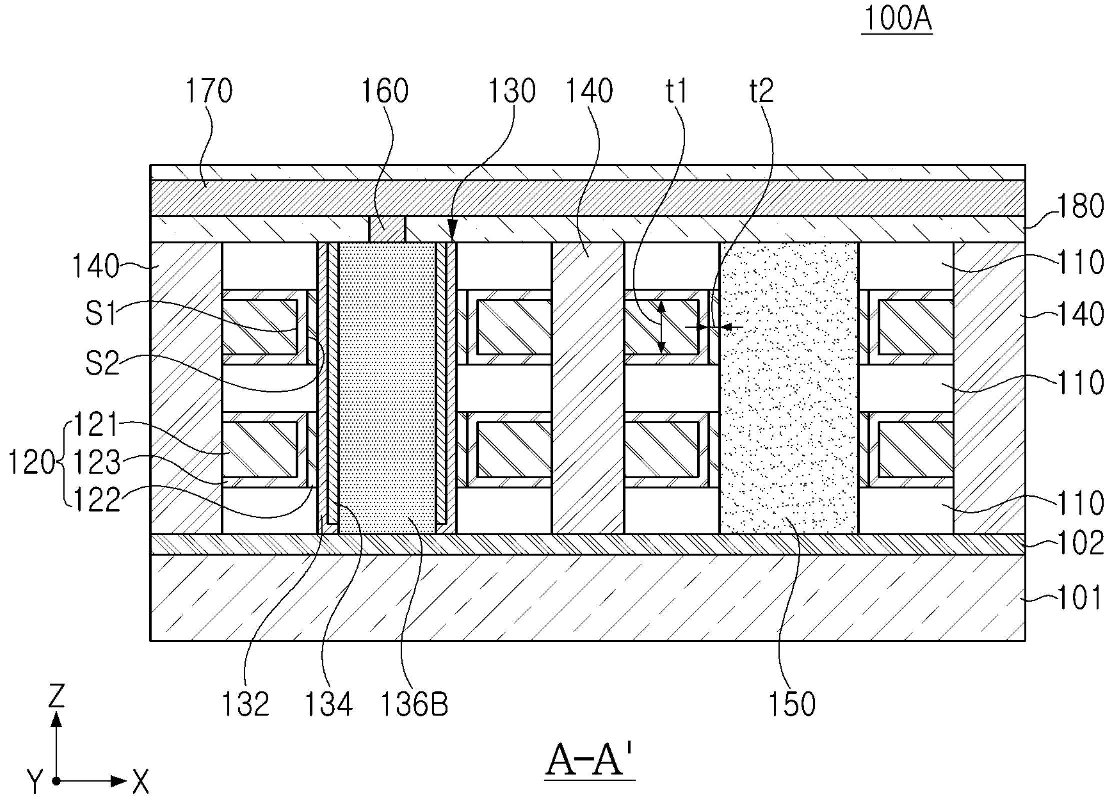
FIGS. 3 to 6 are schematic cross-sectional views of the semiconductor device taken along line A-A' of FIG. 2 according to embodiments of the present inventive concept.

FIG. 3 is a schematic cross-sectional view of the semiconductor device according to an embodiment of the present inventive concept; and FIG. 3 illustrates a cross-section of the semiconductor device of FIG. 2 taken along line A-A'.

Referring to FIGS. 2 and 3, a semiconductor device 100A may include a substrate 101, a buffer insulating layer 102, interlayer insulating layers 110, horizontal structures 120, vertical structures 130, separation line patterns 140, separation insulating patterns 150, a contact plug 160, and a wiring 170. In an embodiment, the wiring 170 may be an interconnection line. The wiring 170 may be a conductive line.

In an embodiment, the substrate 101 may include a semiconductor material, for example, a group IV semiconductor, a group III-V compound semiconductor, or a group II-VI compound semiconductor. However, embodiments of the present inventive concept are no necessarily limited thereto. For example, the group IV semiconductor may include silicon, germanium or silicon-germanium. The substrate 101 may further include the impurities. The substrate 101 may be a silicon substrate, a silicon on insulator (SOI) substrate, a germanium substrate, a germanium on insulator (GOI) substrate, a silicon-germanium substrate, or a substrate including an epitaxial layer.

The buffer insulating layer 102 may be disposed on the substrate 101. The buffer insulating layer 102 may include at least one of an insulating material, silicon oxide, silicon nitride, silicon oxynitride, and silicon oxycarbide. However, embodiments of the present inventive concept are no necessarily limited thereto.

The interlayer insulating layers 110 and the horizontal structures 120 may be alternately stacked on the substrate 101 (e.g., in the Z-direction) to form a stacked structure. The horizontal structures 120 may be spaced apart from each other in the Z-direction by the interlayer insulating layer 110. In an embodiment, the interlayer insulating layers 110 may include at least one of an insulating material, silicon oxide, silicon nitride, silicon oxynitride, and silicon oxycarbide.

The horizontal structures 120 may be stacked on the substrate 101 while being spaced apart from each other (e.g., in the Z-direction). In an embodiment, each of the horizontal structures 120 may include a first conductive layer 121, a second conductive layer 122, and a ferroelectric layer 123. The ferroelectric layer 123 may surround at least a portion of the first conductive layer 121, and the second conductive layer 122 may surround at least a portion of the ferroelectric layer 123.

The first conductive layers 121 may be stacked while being spaced apart from each other in the Z-direction perpendicular to an upper surface of the substrate 101, and extend in a Y-direction parallel to the upper surface of the substrate 101. In an embodiment, the first conductive layer 121 may be a 'word line'. The first conductive layer 121 may have a first thickness t1 in the Z-direction. In an embodiment, the first conductive layer 121 may include doped polysilicon, metal, conductive metal nitride, metal-semiconductor compound, conductive metal oxide, conductive graphene, carbon nanotube, or a combination thereof.

The second conductive layer 122 may be disposed between the ferroelectric layer 123 and a dielectric layer 132 (e.g., in an X-direction parallel to the upper surface of the substrate 101). The second conductive layer 122 may extend in the Y-direction parallel to the upper surface of the substrate 101. In an embodiment, an upper surface of the second conductive layer 122 may be coplanar (e.g., in the Z-direction) with an upper surface of the ferroelectric layer 123, and a lower surface of the second conductive layer 122 may be coplanar (e.g., in the Z-direction) with a lower surface of the ferroelectric layer 123. The second conductive layer 122 may be in direct contact with a side surface of the dielectric layer 132 and spaced apart from the first conductive layer 121 (e.g., in the X-direction). The second conductive layer 122 may have a second thickness t2 in the X-direction parallel to the upper surface of the substrate 101. The first thickness t1 of the first conductive layer 121 (e.g., in the Z-direction) may be greater than the second thickness t2 (e.g., in the X-direction) of the second conductive layer 122. The thickness directions of the first conductive layer 121 and the second conductive layer 122 may be perpendicular to extending directions thereof. In an embodiment, the second conductive layer 122 may include doped polysilicon, metal, conductive metal nitride, metal-semiconductor compound, conductive metal oxide, conductive graphene, carbon nanotube, or a combination thereof.

A ferroelectric layer 123 may be disposed between the first conductive layer 121 and the second conductive layer 122. The ferroelectric layer 123 may cover upper, lower and side surfaces of the first conductive layer 121. The ferroelectric layer 123 may surround the side, upper, and lower surfaces of the first conductive layer 121. The ferroelectric layer 123 may be in direct contact with the interlayer insulating layers 110. For example, upper and lower surfaces of the ferroelectric layer 123 may directly contact the interlayer insulating layers 110. A side surface of the ferroelectric layer 123 may have a first surface S1 and a second surface S2 opposite to each other. The first surface S1 of the ferroelectric layer 123 may be in direct contact with the first conductive layer 121, and the second surface S2 of the ferroelectric layer 123 may be in direct contact with the second conductive layer 122. The ferroelectric layer 123 may form a crystalline phase of an orthorhombic phase (e.g., an O phase) more easily through the first and second surfaces S1 and S2 by disposing the ferroelectric layer 123 between the first conductive layer 121 and the second conductive layer 122. Accordingly, it is possible to provide a semiconductor device having an increased memory window. The ferroelectric layer 123 may be formed of the aforementioned ferroelectric material with reference to FIG. 1A.

The vertical structures 130 may penetrate through the horizontal structures 120 and the interlayer insulating layers 110. In an embodiment, the vertical structures 130 may be spaced apart from each other in the Y-direction by the separation insulating patterns 150. In an embodiment, each of the vertical structures 130 may include a dielectric layer 132, a channel layer 134, a gap-fill insulating layer 135, a vertical source line 136S, and a vertical bit line 136B. The vertical source line 136S and the vertical bit line 136B may each be referred to as a vertical conductive line.

The dielectric layer 132 may extend in the Z-direction to be in direct contact with the buffer insulating layer 102. For example, a bottom surface of the dielectric layer 132 may directly contact an upper surface of the buffer insulating layer 102. The dielectric layer 132 may be in direct contact with the second conductive layer 122 and may extend along a side surface of the second conductive layer 122. A dielectric layer 132 may be disposed between the horizontal structures 120 and the channel layer 134 (e.g., in the X-direction). The dielectric layer 132 may be disposed on (e.g., disposed directly on) a side surface of the channel layer 134. In an embodiment, the dielectric layer 132 may include at least one of silicon oxide, silicon oxynitride, silicon nitride, and a high-k dielectric. However, embodiments of the present inventive concept are not necessarily limited thereto.

The channel layer 134 may be disposed on (e.g., disposed directly thereon) a side surface of the vertical source line 136S and may be disposed on (e.g., disposed directly thereon) a side surface of the vertical bit line 136B. The channel layer 134 may be in direct contact with the vertical source line 136S and the vertical bit line 136B. The channel layer 134 may include a material that may be used as the channel of a transistor, for example, a semiconductor material. For example, in an embodiment, the channel layer 134 may include an oxide semiconductor layer that may be used as the channel region of a transistor or the two-dimensional material layer having a semiconductor characteristic. However, embodiments of the present inventive concept are not necessarily limited thereto.

The gap-fill insulating layer 135 may be disposed between the vertical source line 136S and the vertical bit line 136B (e.g., in the Y-direction). In an embodiment, the gap-fill insulating layer 135 may include at least one of an insulating material, silicon oxide, silicon nitride, silicon oxynitride, and silicon oxycarbide. However, embodiments of the present inventive concept are not necessarily limited thereto. In an embodiment, the channel layer 134 may also extend between the vertical source line 136S and the vertical bit line 136B (e.g., in the Y-direction).

The vertical source line 136S and the vertical bit line 136B may extend in the Z-direction and horizontally overlap (e.g., in the X-direction) the horizontal structures 120. The vertical source line 136S and the vertical bit line 136B may have side surfaces opposite to each other (e.g., in the Y-direction). The vertical source line 136S and the vertical bit line 136B may be spaced apart from each other with the gap-fill insulating layer 135 interposed therebetween (e.g., in the Y-direction). In an embodiment, the vertical source line 136S and the vertical bit line 136B may each include doped polysilicon, metal, conductive metal nitride, metal-semiconductor compound, conductive metal oxide, conductive graphene, or carbon nanotube, or a combination thereof.

The separation line patterns 140 may extend in the Y-direction, and penetrate through the interlayer insulating layers 110 and the horizontal structures 120. The separation line patterns 140 may be disposed parallel to each other and may be arranged in the X-direction. In an embodiment, the separation line pattern 140 may include at least one of an insulating material, silicon oxide, silicon nitride, silicon oxynitride, and silicon oxycarbide. However, embodiments of the present inventive concept are not necessarily limited thereto.

The separation insulating pattern 150 may be disposed between the vertical structures 130. The separation insulating patterns 150 may penetrate through the interlayer insulating layers 110 and the horizontal structures 120. In an embodiment, the separation insulating pattern 150 may include at least one of an insulating material, silicon oxide, silicon nitride, silicon oxynitride, and silicon oxycarbide. However, embodiments of the present inventive concept are not necessarily limited thereto.

The contact plug 160 may be disposed on the vertical structures 130. The contact plug 160 may include a first contact plug electrically connecting the vertical source line 136S to a first wiring 170S and a second contact plug electrically connecting the vertical bit line 136B to a second wiring 170B. In an embodiment, the contact plug 160 may include metal, conductive metal nitride, metal-semiconductor compound, conductive metal oxide, or a combination thereof. In an embodiment, the first wiring 170S may be a first interconnection line or a first conductive line. The second wiring 170B may be a second interconnection line or a second conductive line.

The wiring 170 may be disposed on the vertical structures 130 and may extend in the X-direction. The wiring 170 may include the first wiring 170S on the vertical source line 136S and the second wiring 170B on the vertical bit line 136B. In an embodiment, the wiring 170 may include metal, conductive metal nitride, metal-semiconductor compound, conductive metal oxide, or a combination thereof. However, embodiments of the present inventive concept are not necessarily limited thereto.

Figure 4:
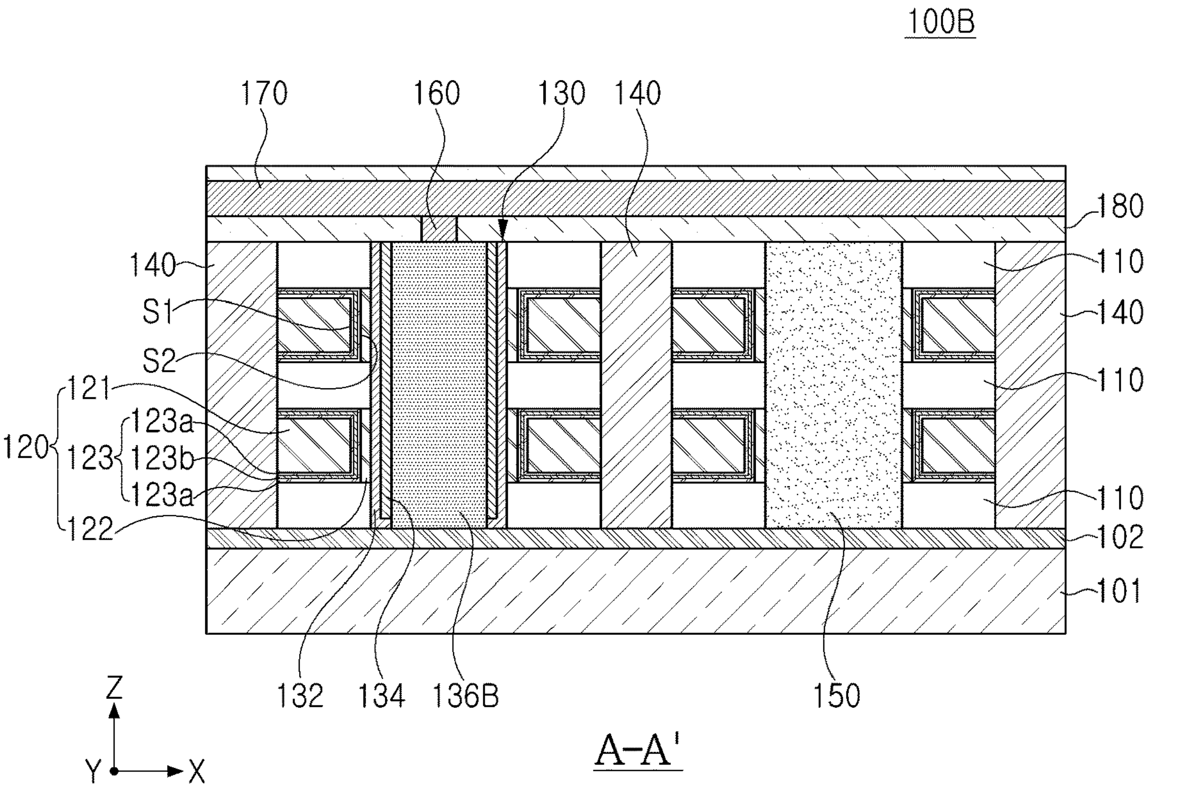
Figure 5:
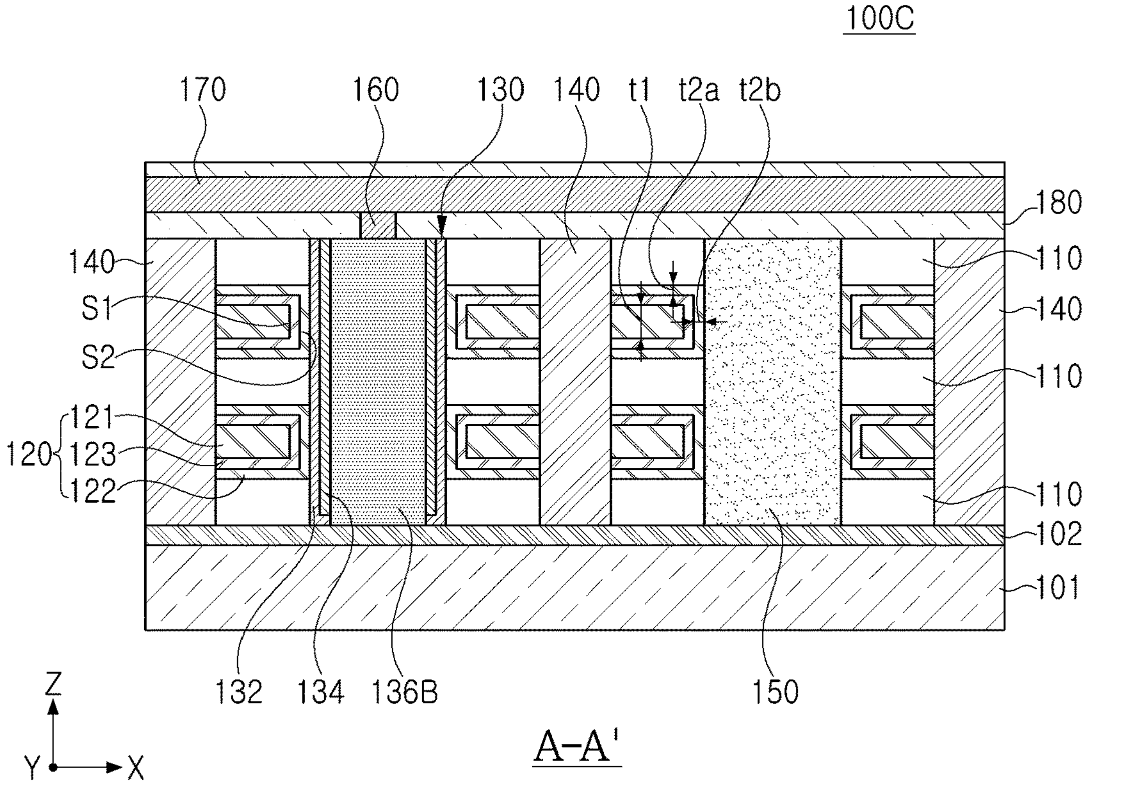
Figure 6:
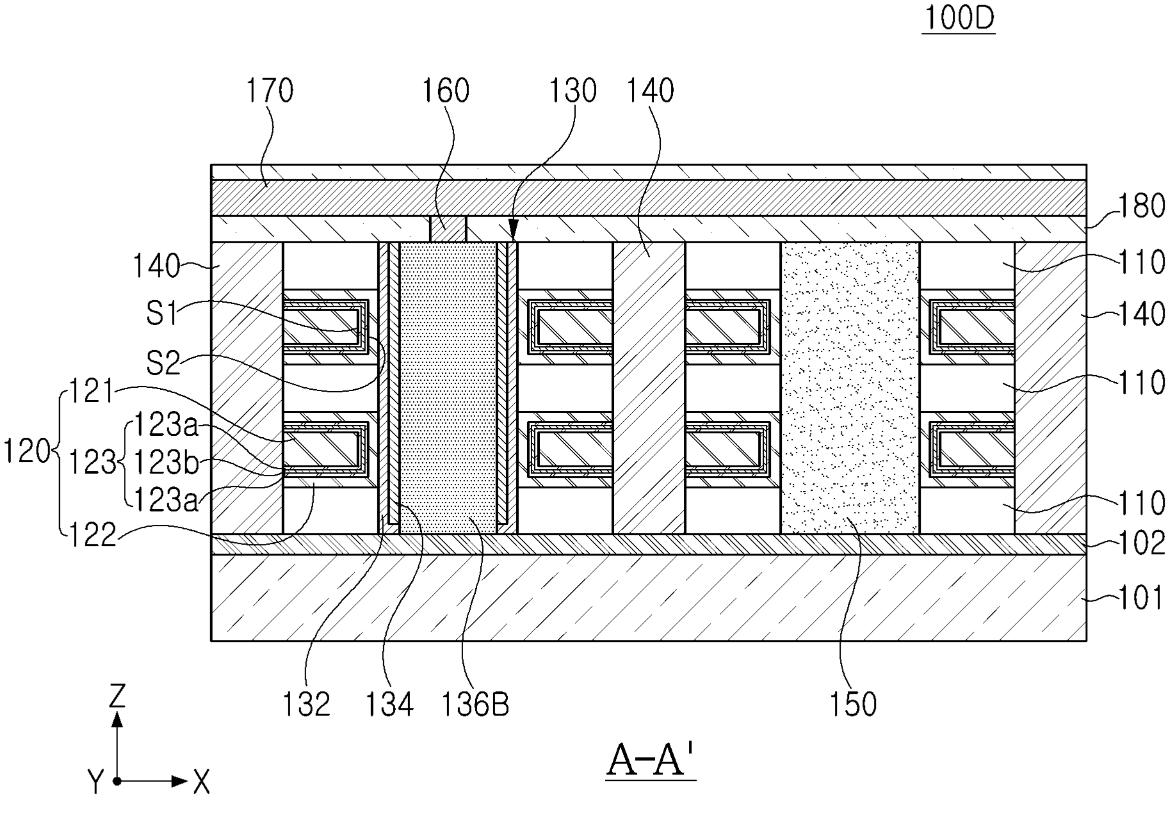

FIGS. 4 to 6 are schematic cross-sectional views of the semiconductor device according to embodiments of the present inventive concept; FIGS. 4 to 6 show regions corresponding to a cross-section of the semiconductor device of FIG. 2 taken along line A-A'.

Referring to FIG. 4, the ferroelectric layer 123 of the semiconductor device 100B may have a structure in which a first layer 123*a* and a second layer 123*b* are alternately laminated on each other. For example, the first layer 123*a* may include a first ferroelectric material, and the second layer 123*b* may include a second ferroelectric material that is different from the first ferroelectric material. In an embodiment the first layer 123*a* may include a ferroelectric material, and the second layer 123*b* may include an insulating material different from that of the first ferroelectric material of the first layer 123*a*. The polarization of the ferroelectric layer 123 may be increased and the memory window may be increased, by a structure of the ferroelectric layer 123 in which the first layer 123*a* and the second layer 123*b* are alternately laminated on each other.

Referring to FIG. 5, in the horizontal structures 120 of a semiconductor device 100C, the ferroelectric layer 123 may cover the upper, lower and side surfaces of the first conductive layer 121, and the second conductive layer 122 may cover the upper, lower and side surfaces of the ferroelectric layer 123. For example, the second conductive layer 122 may surround the side, upper, and lower surfaces of the ferroelectric layer 123. The second conductive layer 122 may include a portion extending horizontally (e.g., in the X-direction) between the ferroelectric layer 123 and the interlayer insulating layer 110. The ferroelectric layer 123 may be spaced apart from the interlayer insulating layers 110. The second conductive layer 122 may have a first thickness t2*a* in the Z-direction and a second thickness t2*b* in the X-direction, and the first thickness t1 of the first conductive layer 121 may be greater than the first and second thicknesses t2*a* and t2*b* of the second conductive layer 122.

Referring to FIG. 6, the ferroelectric layer 123 of a semiconductor device 100D may have a structure in which the first layer 123*a* and the second layer 123*b* are alternately laminated on each other. The ferroelectric layer 123 of the semiconductor device 100D of FIG. 6 may be similar to that obtained by applying the structure of the ferroelectric layer 123 of the semiconductor device 100B of FIG. 4 to the semiconductor device 100C of FIG. 5. A description of the ferroelectric layer 123 of the semiconductor device 100D of FIG. 6 refers to the description provided with reference to FIG. 4.

Figure 7A:
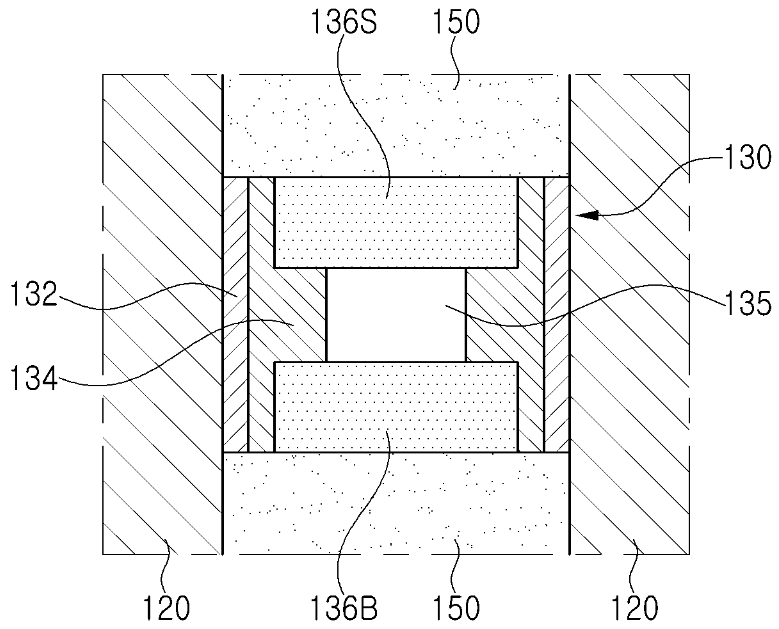
FIGS. 7A and 7B are partially enlarged views of the semiconductor device according to embodiments of the present inventive concept.
Figure 7B:
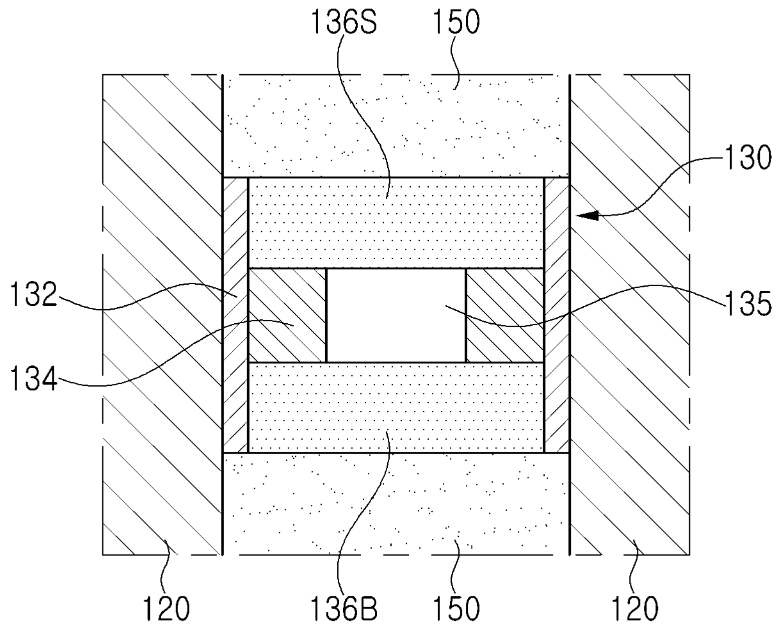

FIGS. 7A and 7B are partially enlarged views of the semiconductor device according to embodiments of the present inventive concept. FIGS. 7A and 7B show an enlarged plan structure of the vertical structure 130 of the semiconductor device.

Referring to FIG. 7A, at least two surfaces of the vertical source line 136S may be in direct contact with the channel layer 134 at one end of the vertical source line 136S of the vertical structure 130. At least two surfaces of the vertical bit line 136B may be in direct contact with the channel layer 134 at one end of the vertical bit line 136B of the vertical structure 130.

Referring to FIG. 7B, the dielectric layer 132 may be in direct contact with the vertical source line 136S and the vertical bit line 136B. In an embodiment, the vertical source line 136S and the vertical bit line 136B may each extend longer in a horizontal direction than shown in FIG. 7A.

FIGS. 8A to 13B are views for explaining a method of manufacturing a semiconductor device according to embodiments of the present inventive concept; FIGS. 8B, 9B, 10B, 11B, 12B, and 13B respectively show the cross-sections taken along the line A-A' of FIGS. 8A, 9A, 10A, 11A, 12A, and 13A.

Figure 8A:
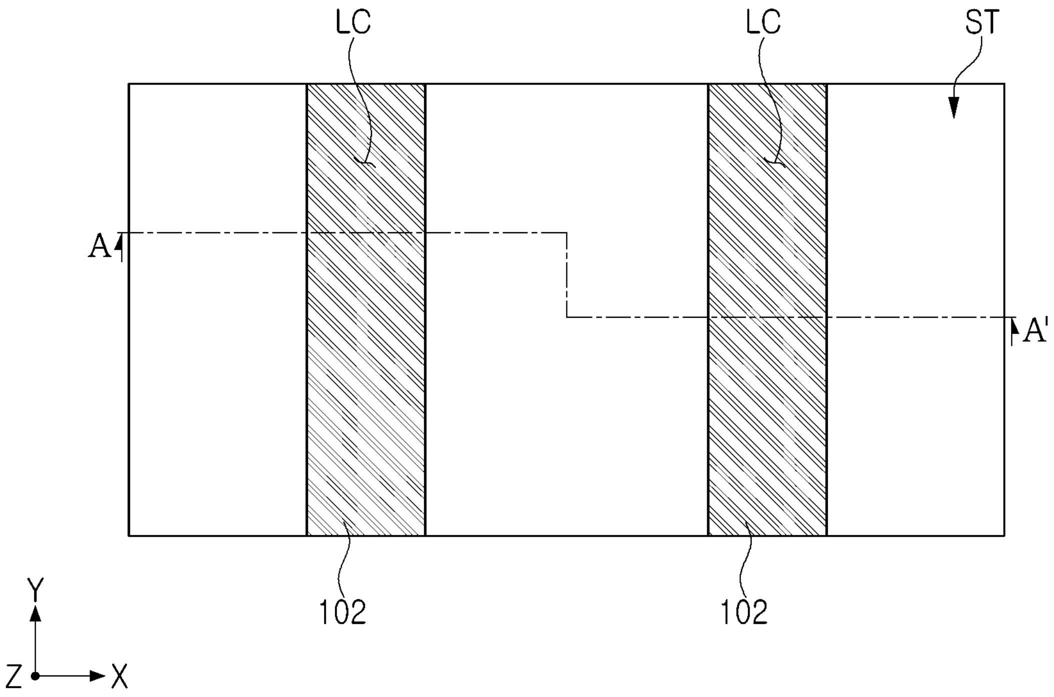
FIGS. 8A to 13B are views for explaining a method of manufacturing a semiconductor device according to embodiments of the present inventive concept.
Figure 8B:
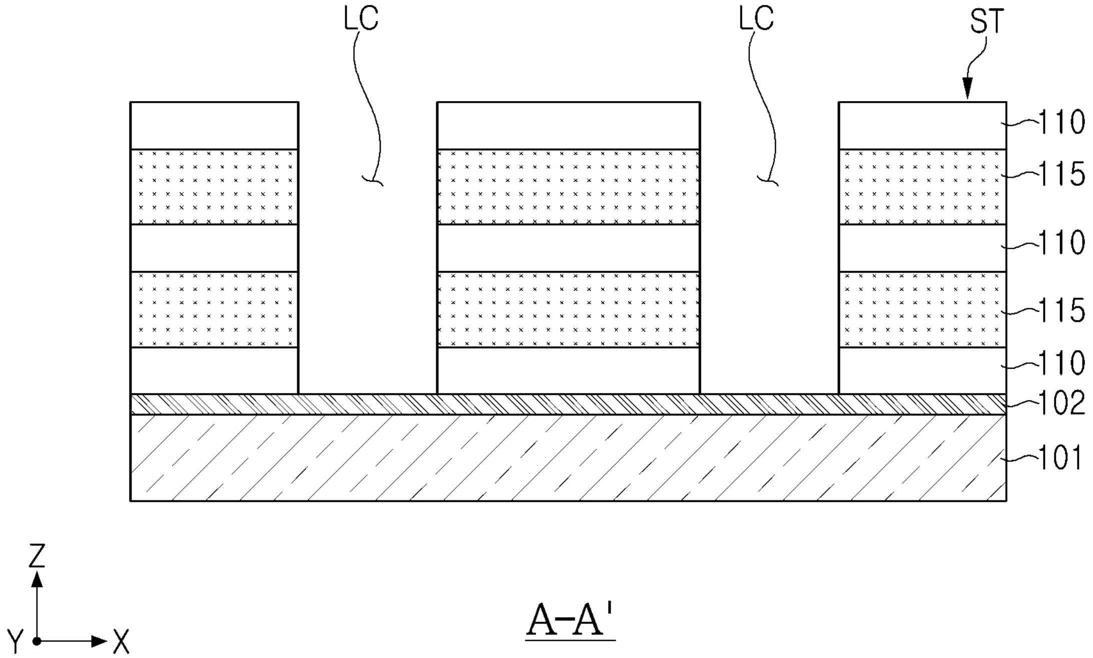

Referring to FIGS. 8A and 8B, a stacked structure ST my be formed by alternately laminating (e.g., in the Z-direction) the interlayer insulating layers 110 and sacrificial layers 115 on the substrate 101 and the buffer insulating layer 102. Line trenches LC penetrate through the stacked structure ST and extend in the Y-direction.

Sacrificial layers 115 may be layers replaced with the horizontal structures 120 (see FIG. 3) through a subsequent process. The sacrificial layer 115 may be formed of a material different from that of the interlayer insulating layer 110. For example, the sacrificial layer 115 may be formed of a material that may be etched with etch selectivity under a specific etching condition with respect to the interlayer insulating layer 110. For example, in an embodiment the interlayer insulating layer 110 may be formed of silicon oxide, and the sacrificial layer 115 may be formed of silicon nitride. However, embodiments of the present inventive concept are not necessarily limited thereto.

The line trenches LC may be formed by partially opening an upper portion of the stacked structure ST by using a separate mask layer and then partially etching the stacked structure ST. In an embodiment, the line trenches LC may expose a side surface of the buffer insulating layer 102 and that of the sacrificial layer 115. For example, in an embodiment shown in FIG. 8B, the line trenches LC expose a lateral side surface of the sacrificial layer 115 and an upper surface of the buffer insulating layer 102. However, embodiments of the present inventive concept are not necessarily limited thereto.

Figure 9A:
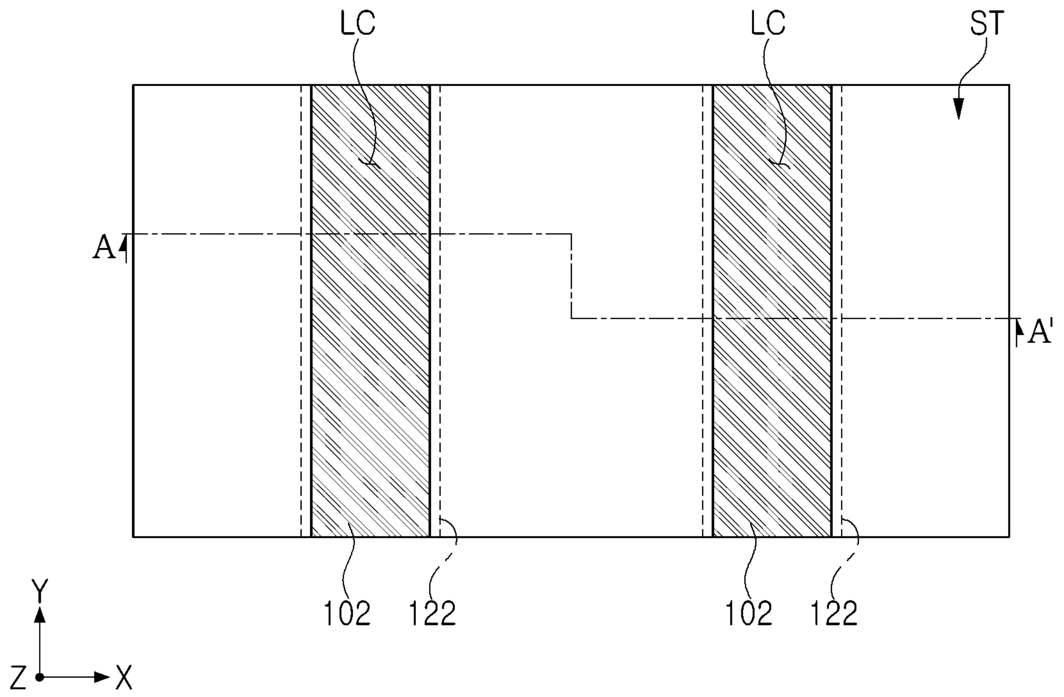
Figure 9B:
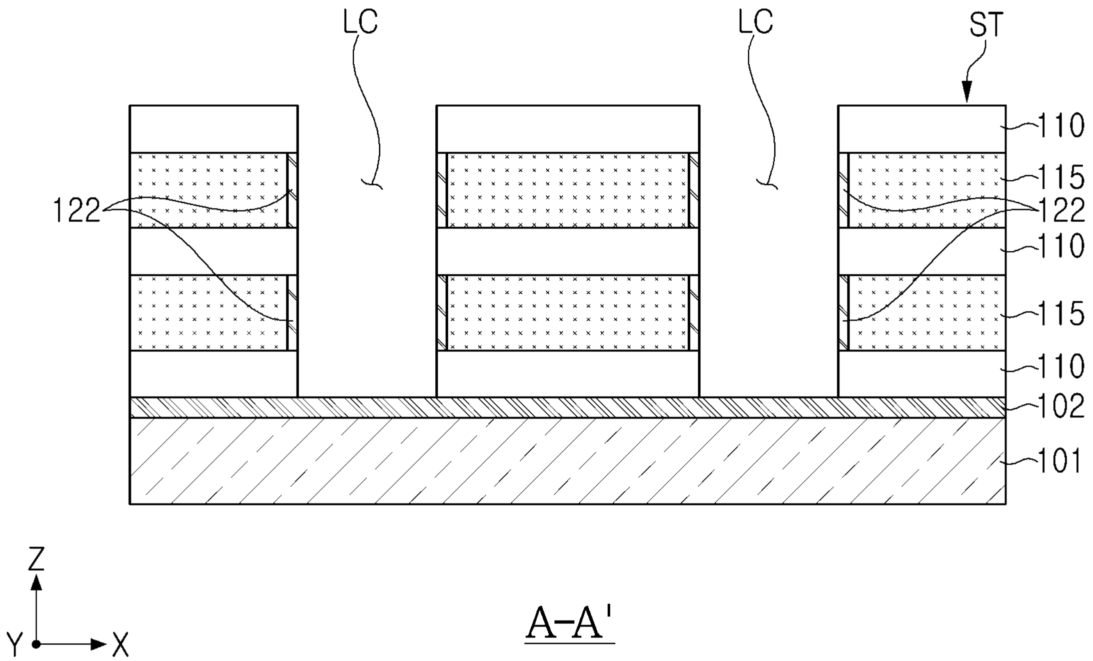

Referring to FIGS. 9A and 9B, the second conductive layer 122 may be formed after partially removing the side surfaces of the sacrificial layers 115, exposed through the line trenches LC.

For example, in an embodiment a wet etching process may be performed to partially remove the sacrificial layers 115 exposed through the line trenches LC. A conductive material may be deposited on the regions which the sacrificial layers 115 are partially removed and on the line trenches LC. In an embodiment, a separate etching process may then be additionally performed on the conductive material, thereby forming the second conductive layers 122 spaced apart from each other in the Z-direction.

Figure 10A:
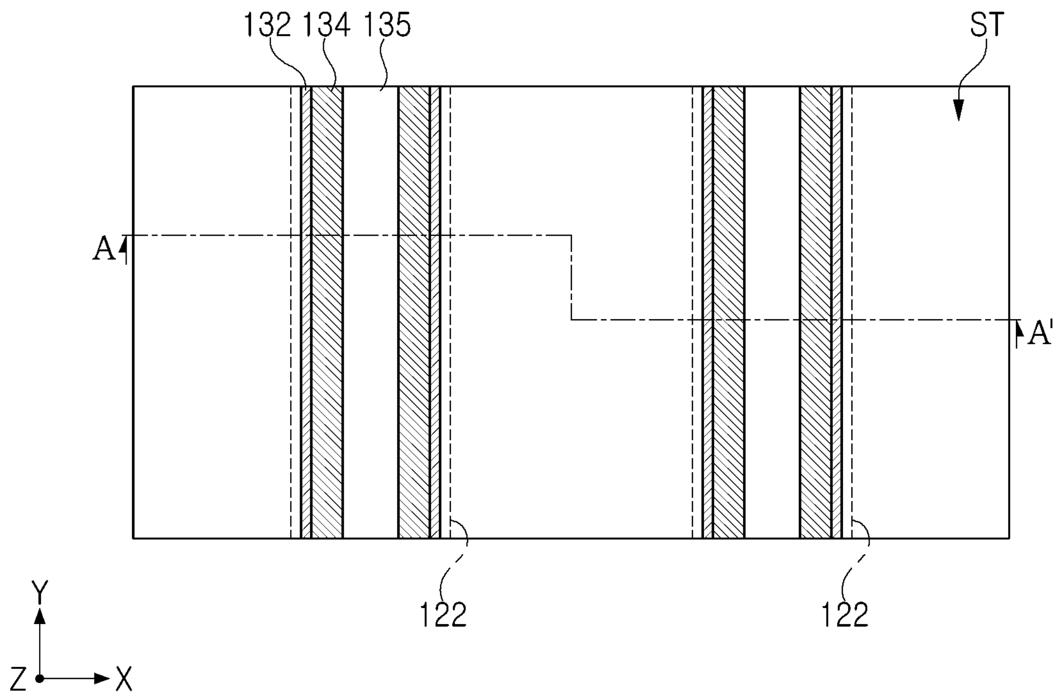
Figure 10B:
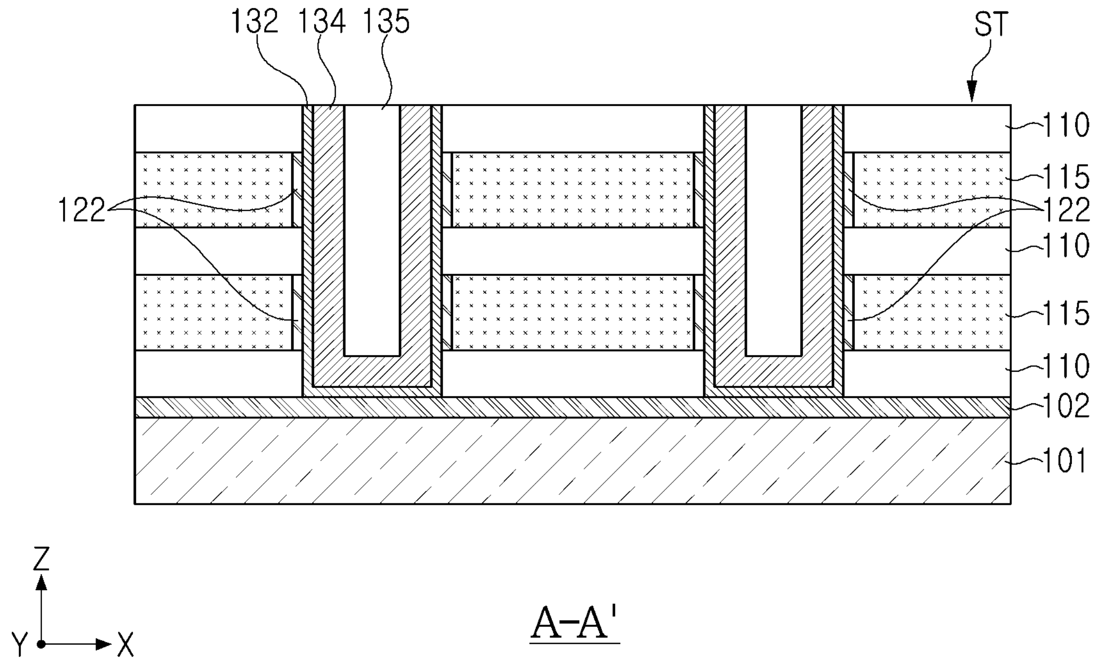

Referring to FIGS. 10A and 10B, the dielectric layer 132, the channel layer 134, and the gap-fill insulating layer 135 may be sequentially positioned in (e.g., disposed in) the line trenches LC. The dielectric layer 132 may cover side and bottom surfaces of the line trenches LC. The channel layer 134 may be disposed on the dielectric layer 132 and may define a space. For example, in an embodiment the channel layer 134 may be substantially U-shaped and may define an inner space. The gap-fill insulating layer 135 may fill the space in the line trench LC defined by the channel layer 134 to be in direct contact with the channel layer 134. A planarization process may then be performed.

Figure 11A:
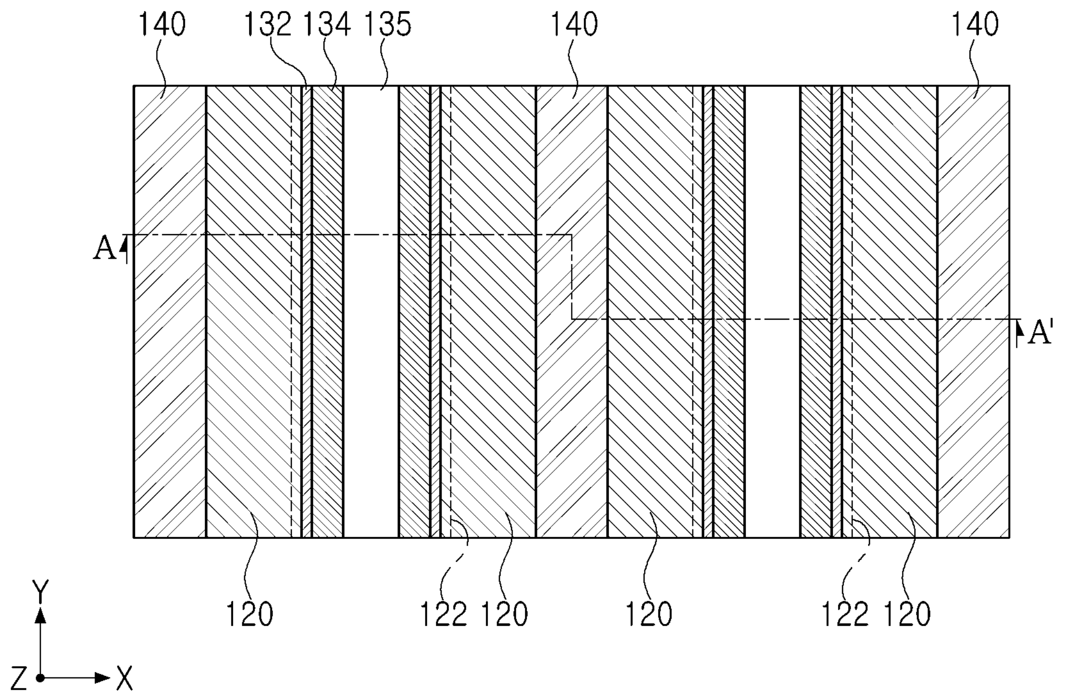
Figure 11B:
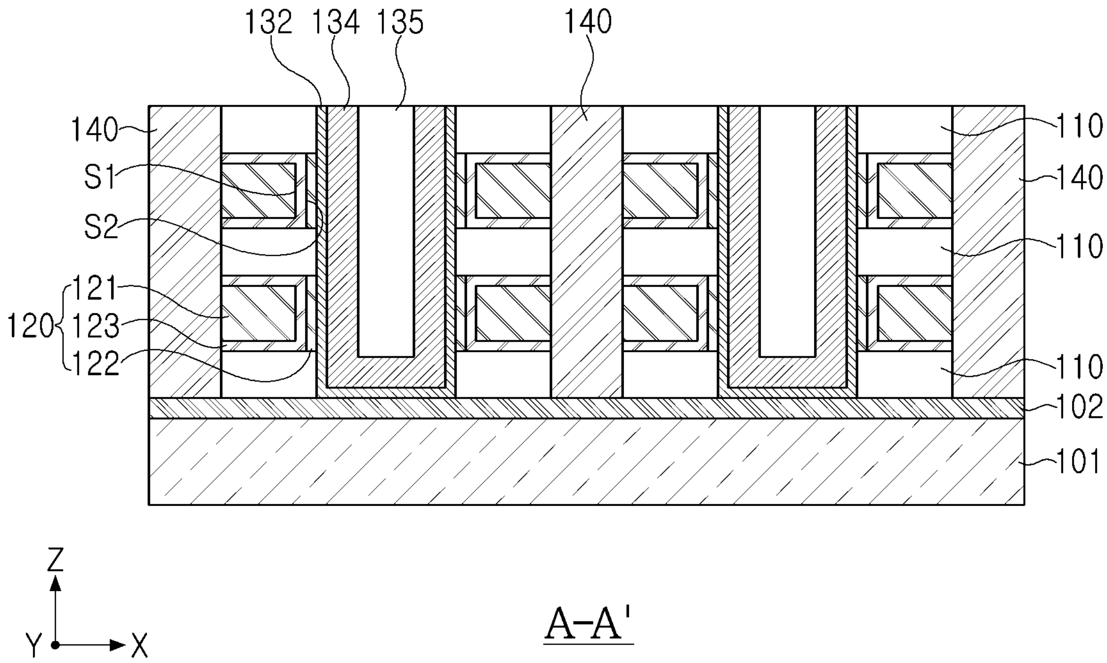

Referring to FIGS. 11A and 11B, separation trenches penetrating through the stacked structures ST and extending in the Y-direction may be formed. The sacrificial layers 115 may then be removed through the separation trenches. The first conductive layers 121 and the ferroelectric layers 123 may be formed in the regions that the sacrificial layers 115 are removed, and the separation line patterns 140 may be formed in the separation trenches.

The separation trench may be formed between the line trenches LC. The separation trenches may expose other side surfaces of the sacrificial layers 115. The sacrificial layers 115 may be selectively removed with respect to the interlayer insulating layers 110. The first conductive layer 121 and the ferroelectric layer 123 may be formed in the region that the sacrificial layer 115 is removed, thereby forming the horizontal structure 120 including the first conductive layer 121, the ferroelectric layer 123, and the second conductive layer 122.

Figure 12A:
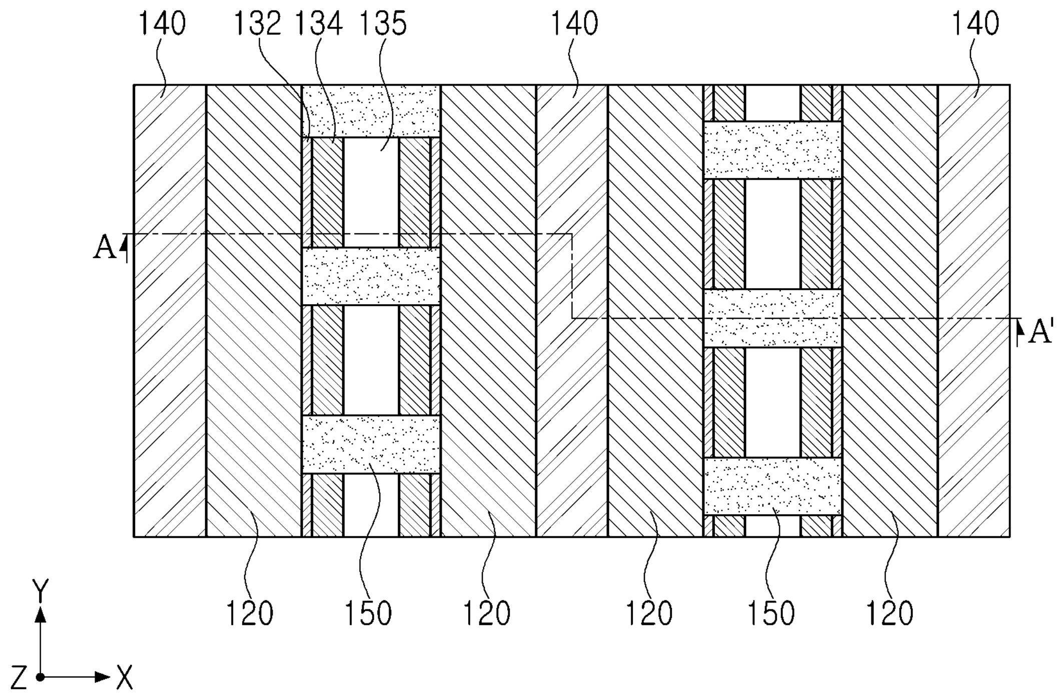
Figure 12B:
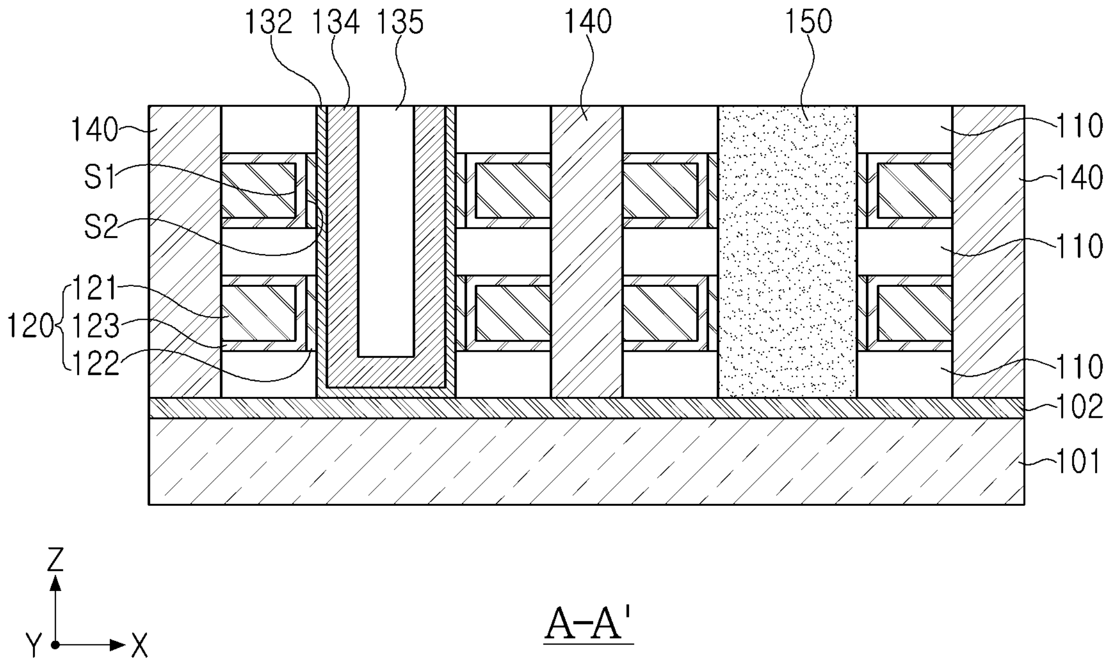

Referring to FIGS. 12A and 12B, the separation insulating patterns 150 isolating the plurality of layers may be formed in the line trenches LC and may be arranged in the Y-direction. For example, in an embodiment the separation insulating patterns 150 may be positioned at predetermined intervals in the Y-direction. The channel layer 134 may be isolated in the Y-direction by the separation insulating patterns 150. The planarization process may then be performed.

Figure 13A:
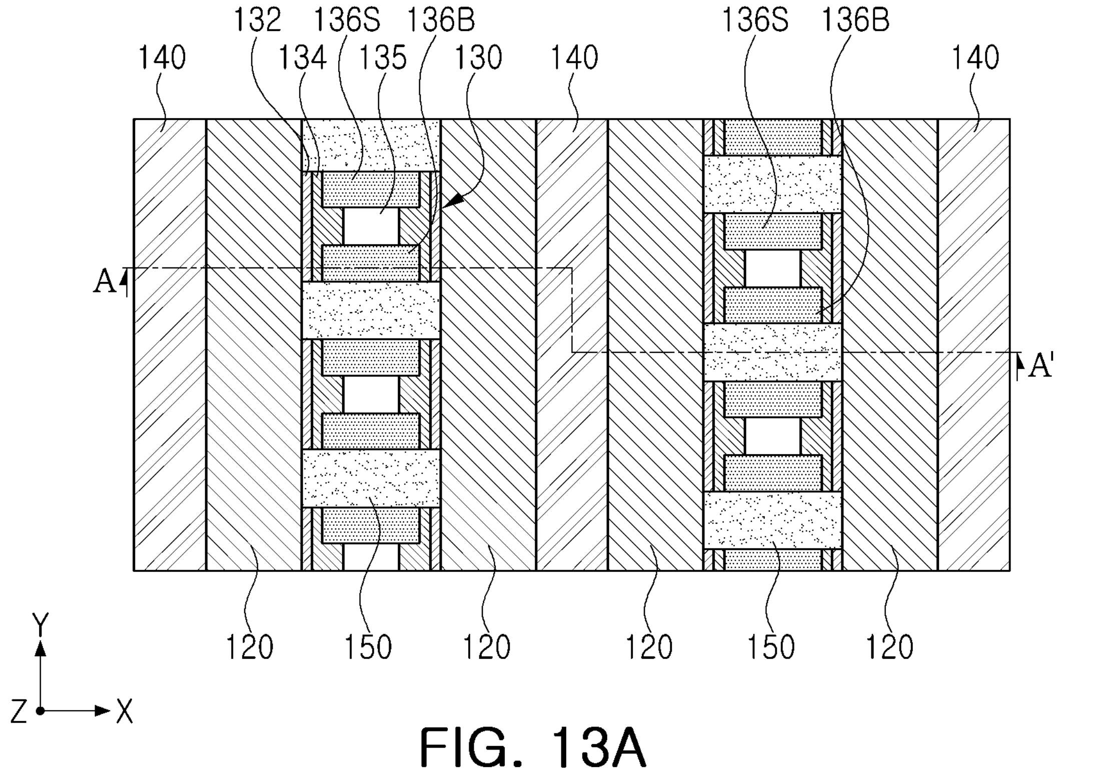
Figure 13B:
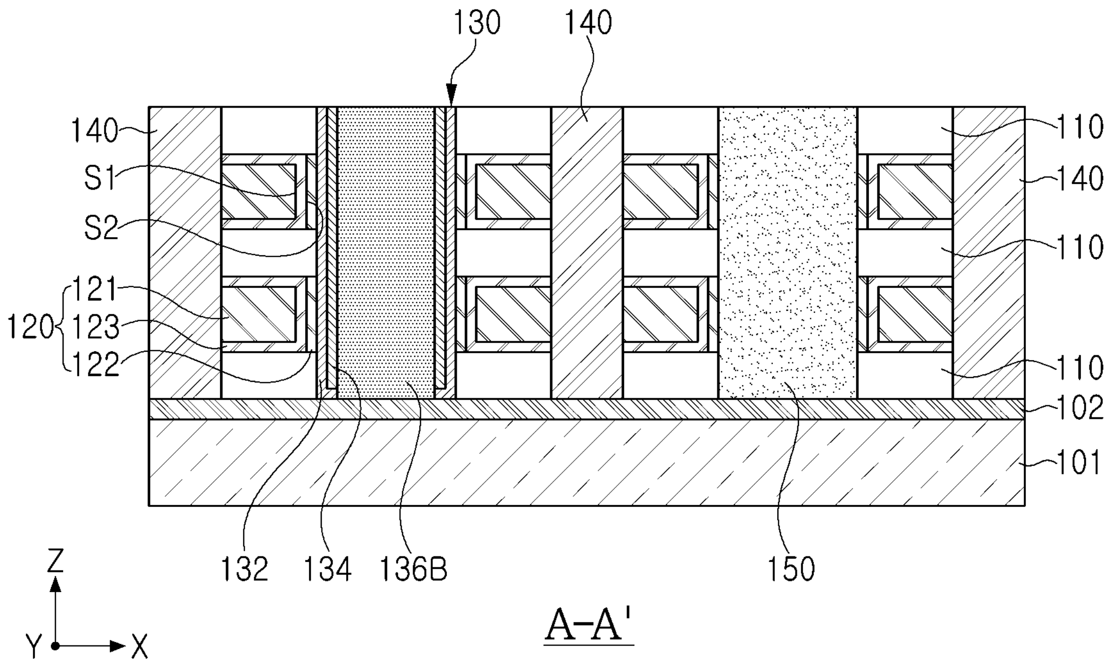

Referring to FIGS. 13A and 13B, the vertical source line 136S and the vertical bit line 136B may be formed to be in direct contact with the channel layer 134. A portion of the channel layer 134 and a portion of the gap-fill insulating layer 135 may be etched, and the conductive material may then be deposited to form the vertical source line 136S and the vertical bit line 136B.

The semiconductor device of FIG. 2 may then be manufactured by forming an upper insulating layer 180, the contact plug 160, and the wiring 170.

FIGS. 14A to 17B are views for explaining a method of manufacturing a semiconductor device according to embodiments of the present inventive concept. FIGS. 14B, 15B, 16B, and 17B respectively show the cross-sections taken along the line A-A' of FIGS. 14A, 15A, 16A, and 17A.

Figure 14A:
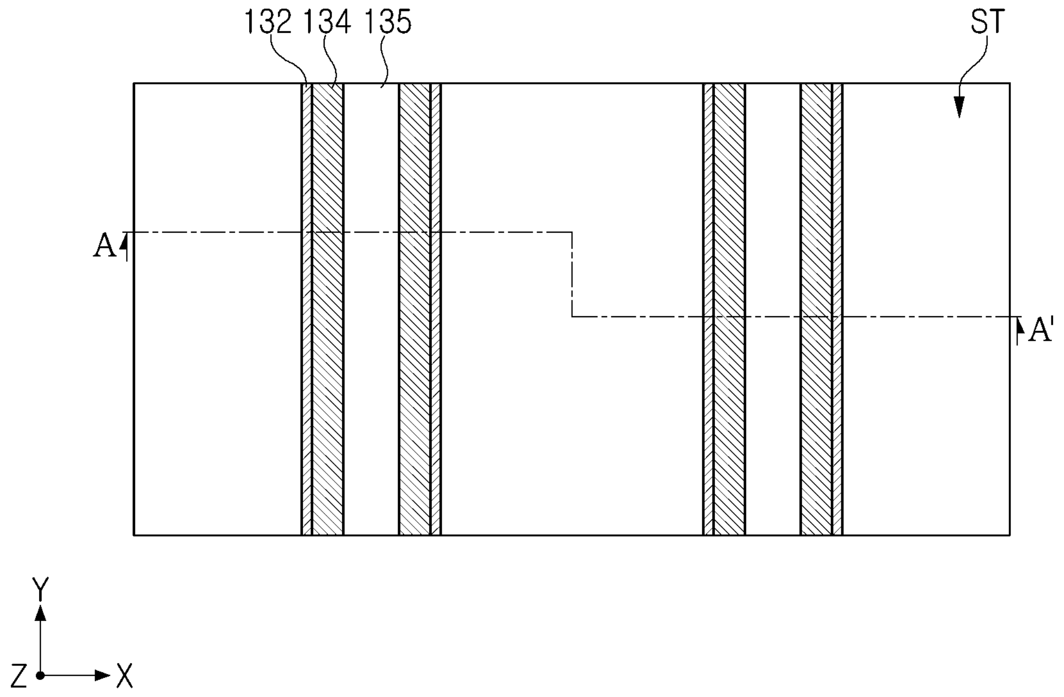
FIGS. 14A to 17B are views for explaining a method of manufacturing a semiconductor device according to embodiments of the present inventive concept.
Figure 14B:
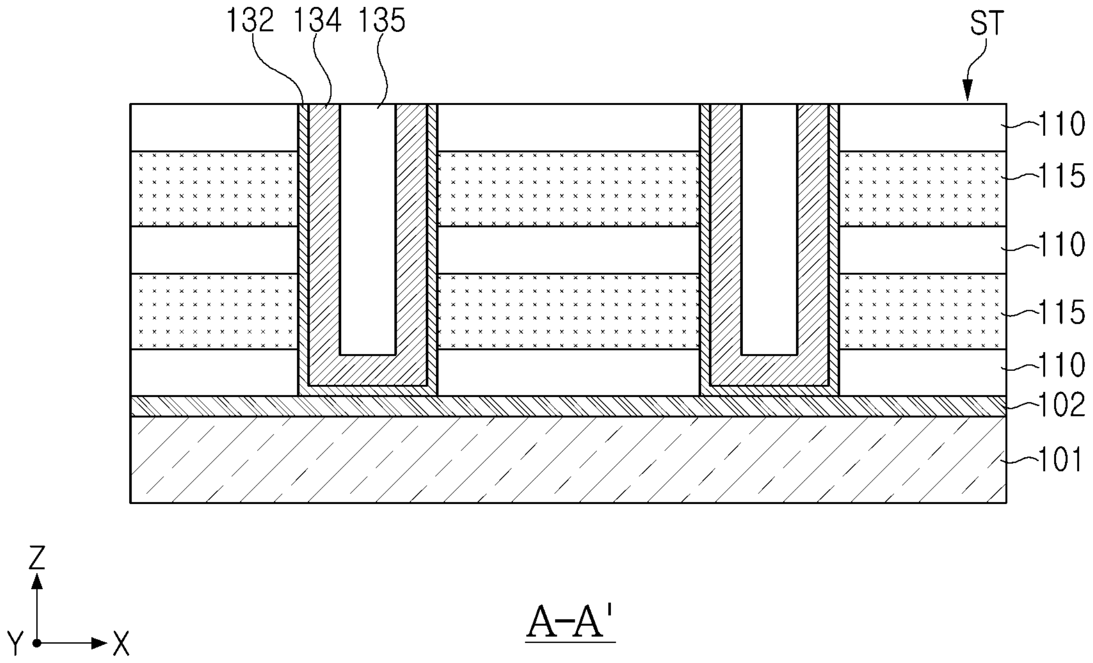

Referring to FIGS. 14A and 14B, the line trenches may be formed to penetrate through the stacked structure ST, and then the dielectric layer 132, the channel layer 134, and the gap-fill insulating layer 135 may be sequentially formed in the line trenches. The dielectric layer 132 may be in direct contact with the sacrificial layer 115 (e.g., side surfaces of the sacrificial layer 115).

Figure 15A:
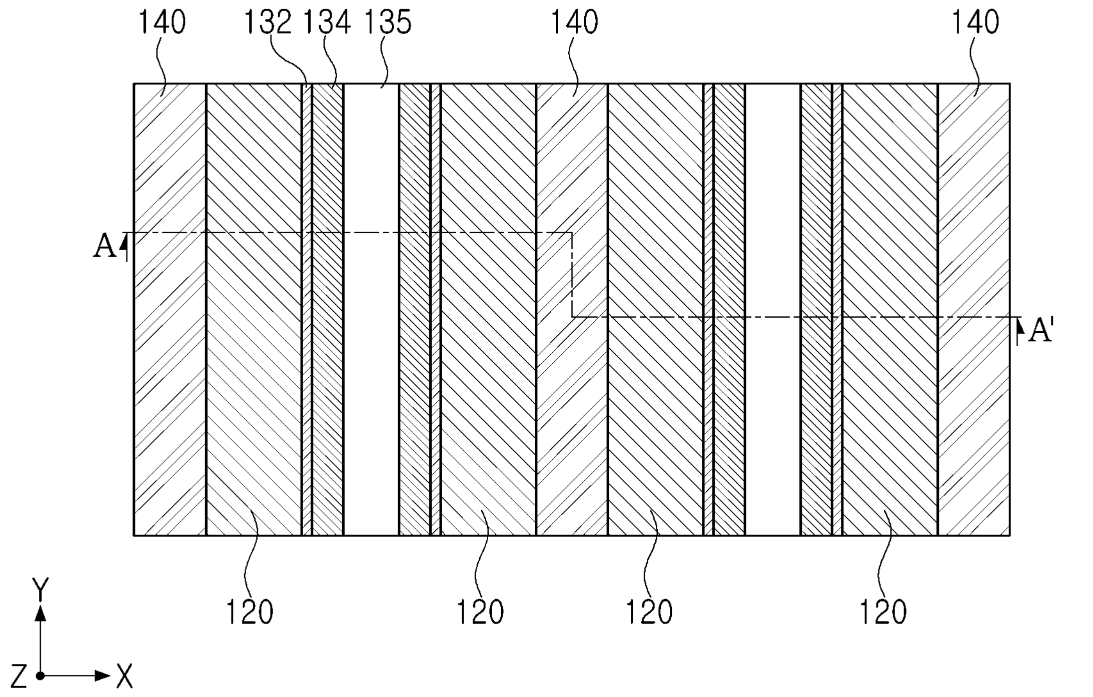
Figure 15B:
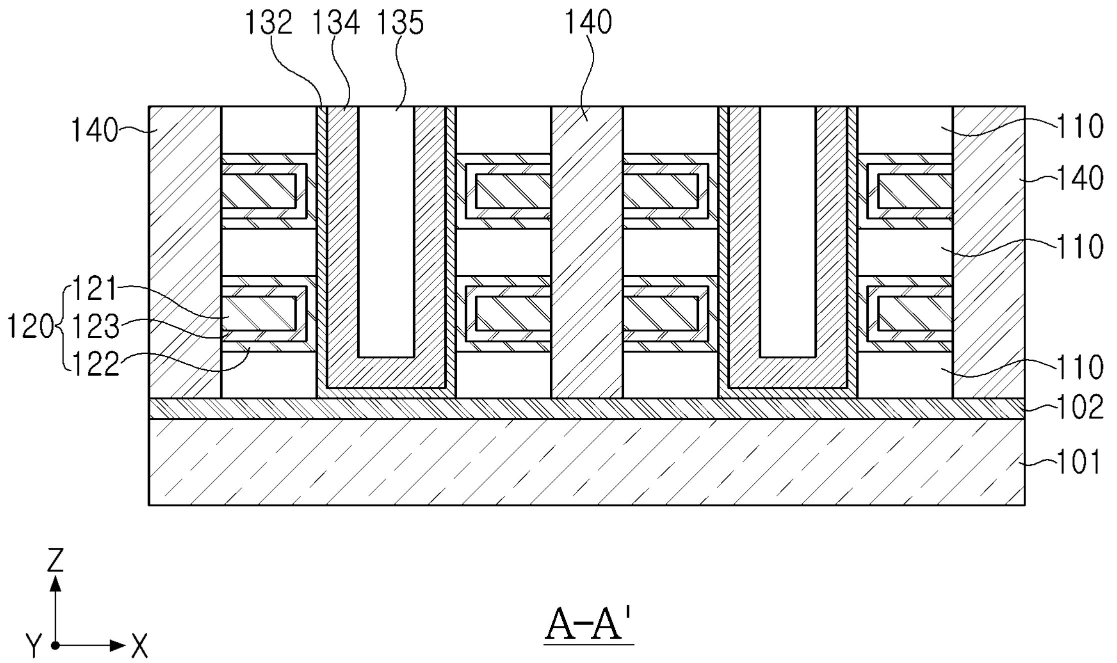

Referring to FIGS. 15A and 15B, the separation trenches penetrating through the stacked structures ST and extending in the Y-direction may be formed. The sacrificial layers 115 may then be removed through the separation trenches. The first conductive layers 121, the ferroelectric layers 123, and the second conductive layers 122 may then be formed in the regions that the sacrificial layers 115 are removed. The separation line patterns 140 may be formed in the separation trenches.

Figure 16A:
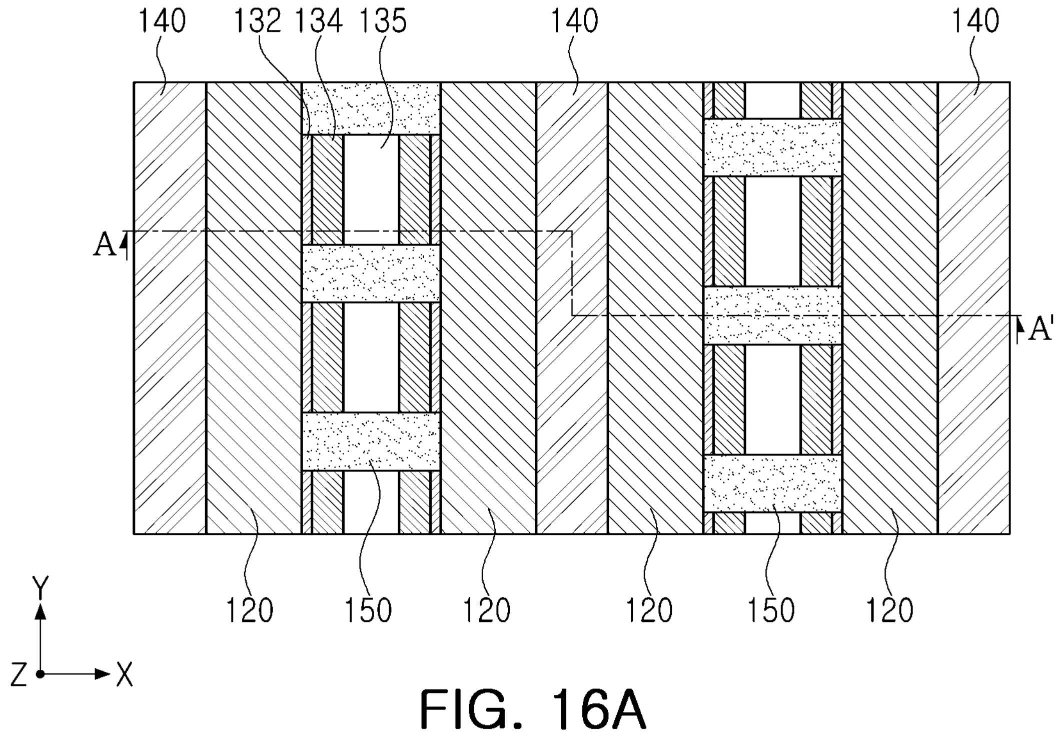
Figure 16B:
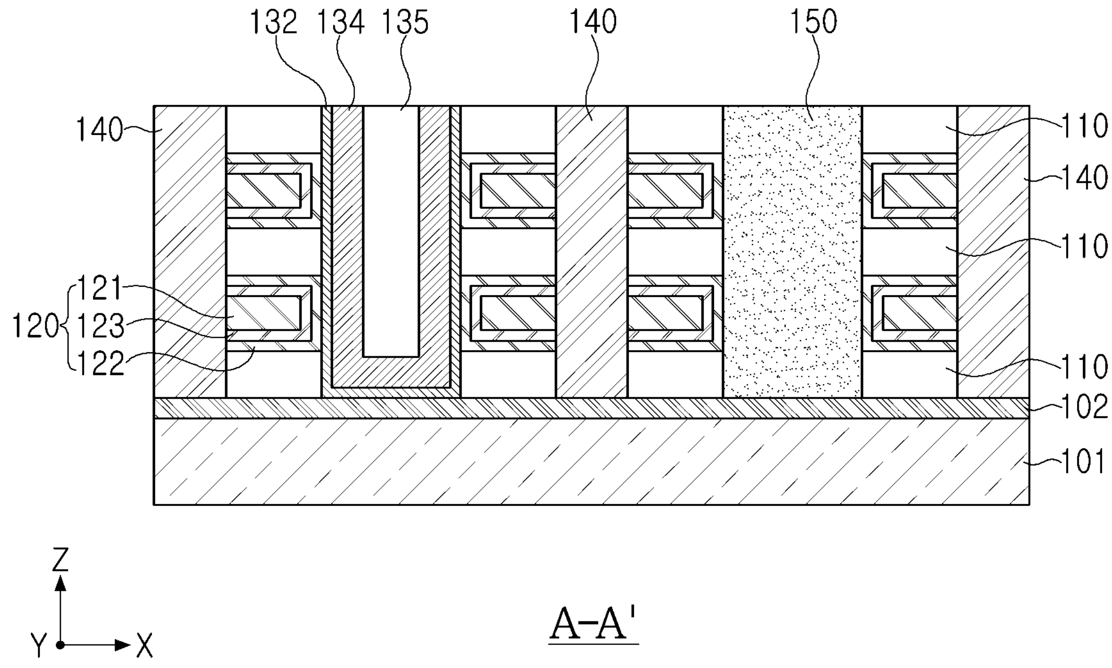

Referring to FIGS. 16A and 16B, the separation insulating patterns 150 isolating the channel layer 134*s* may be formed and may be arranged in the Y-direction. In an embodiment, the separation insulating patterns 150 may be positioned at predetermined intervals in theY-direction. The planarization process may then be performed.

Figure 17A:
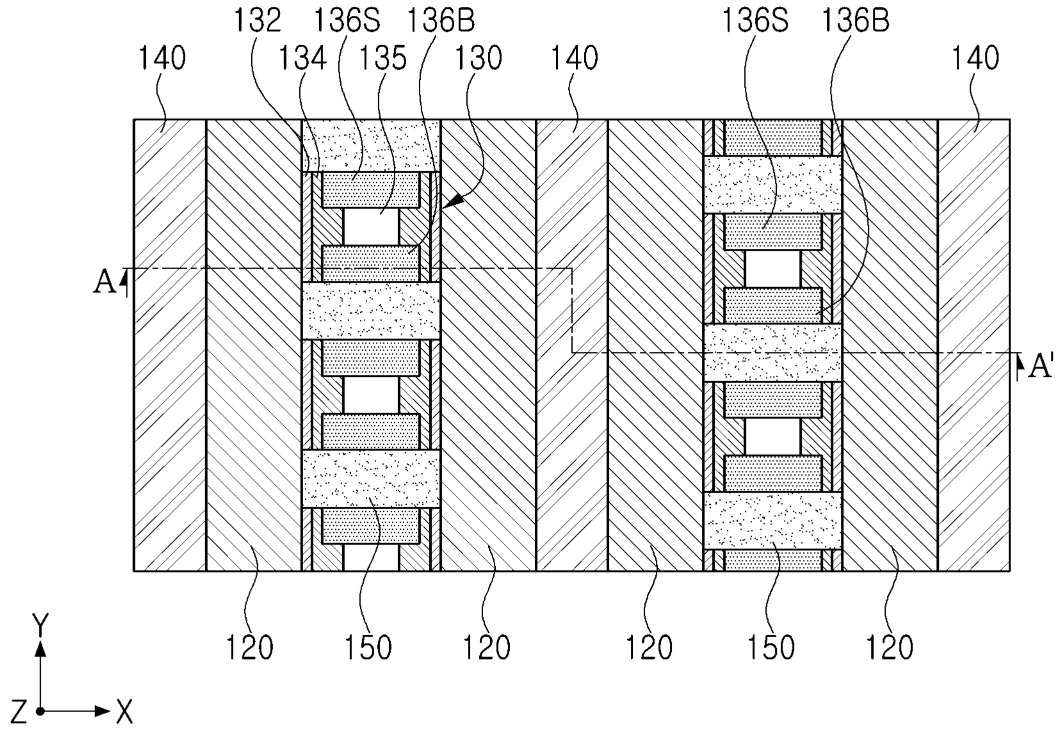
Figure 17B:
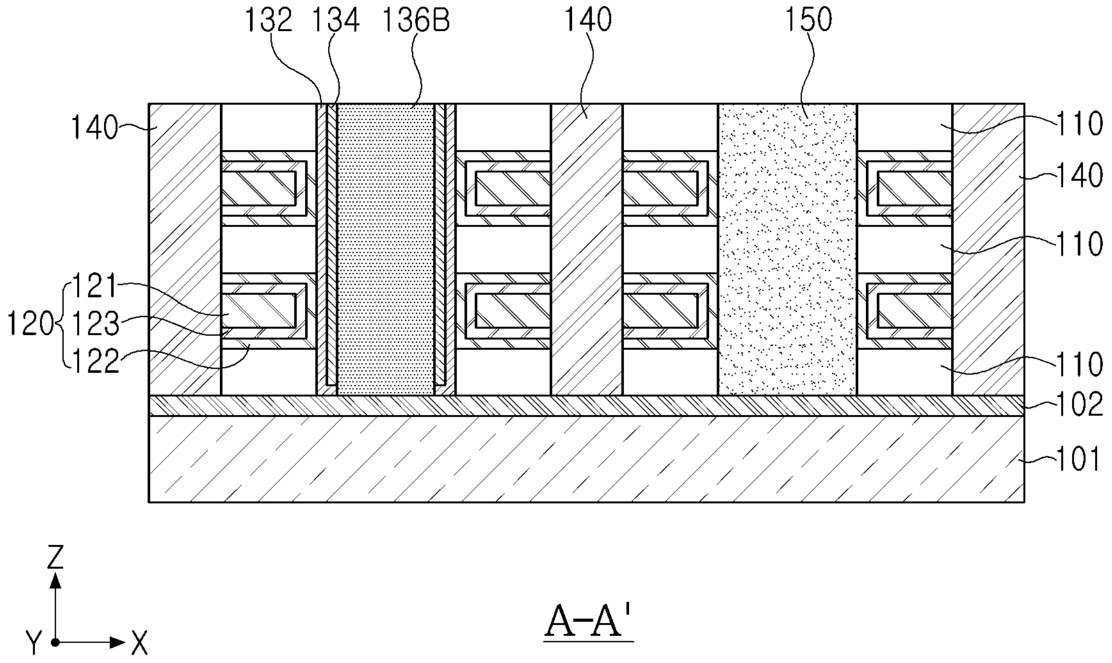

Referring to FIGS. 17A and 17B, the vertical source line 136S and the vertical bit line 136B may be formed to be in direct contact with the channel layer 134. A portion of the channel layer 134 and a portion of the gap-fill insulating layer 135 may be etched, and the conductive material may then be deposited to form the vertical source line 136S and the vertical bit line 136B.

Figure 18:
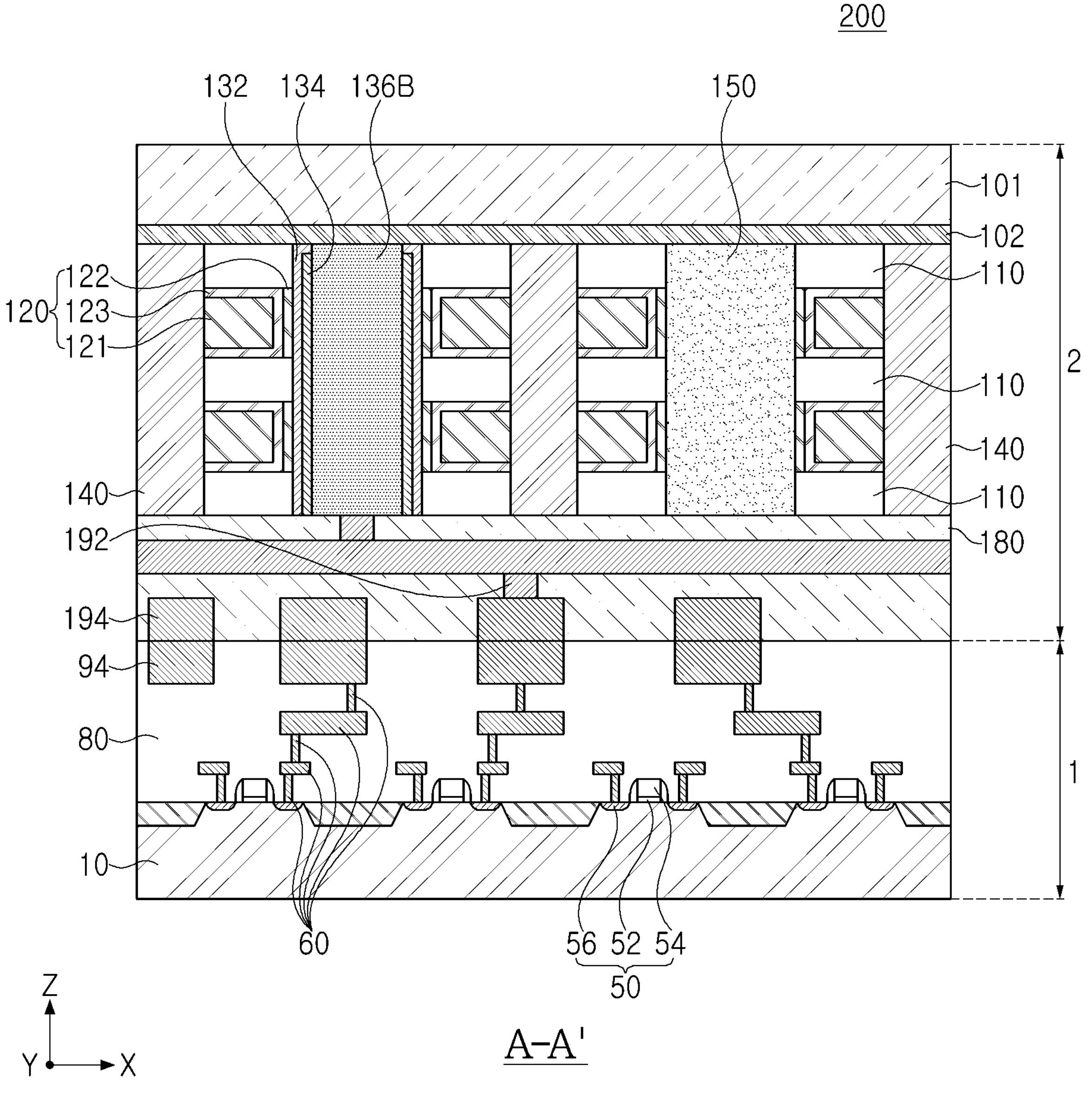
FIG. 18 is a schematic cross-sectional view of a semiconductor device taken along line A-A' of FIG. 2 according to an embodiment of the present inventive concept.

FIG. 18 is a schematic cross-sectional view of a semiconductor device according to an embodiment. FIG. 18 illustrates the region corresponding to the cross-section of FIG. 2 taken along the line A-A'.

Referring to FIG. 18, a semiconductor device 200 may include a first structure 1 and a second structure 2 disposed on the first structure 1 (e.g., in the Z-direction). The first structure 1 may be a peripheral circuit region in which circuit elements for operating memory cells of the second structure 2 are disposed. The second structure 2 may include the substrate 101, the buffer insulating layer 102, the interlayer insulating layers 110, the horizontal structures 120, the vertical structures 130, the separation line patterns 140, the separation insulating patterns 150, the contact plug 160, the upper insulating layer 180, and the wiring 170. The first structure 1 may include a base substrate 10, circuit elements 50, a lower wiring structure 60, and a lower insulating layer 80. The lower wiring structure 60 may include an interconnection line and a contact plug. The first structure 1 may further include a lower bonding pad 94. The second structure 2 may further include an upper bonding pad 194. The lower bonding pad 94 and the upper bonding pad 194 may be in direct contact with each other. For example, in an embodiment, the lower bonding pad 94 and the upper bonding pad 194 may be bonded with each other by copper-to-copper bonding. However, embodiments of the present inventive concept are not necessarily limited thereto.

In an embodiment, the base substrate 10 may include a semiconductor material, for example, a group IV semiconductor, a group III-V compound semiconductor, or a group II-VI compound semiconductor. The circuit elements 50 may include transistors. Each of the circuit elements 50 may include a circuit gate dielectric layer 52, a circuit gate electrode 54, and source/drain regions 56. The source/drain regions 56 may be disposed on both sides of the circuit gate electrode 54 in the base substrate 10. The lower wiring structure 60 may be electrically connected to the circuit gate electrode 54 or the source/drain regions 56. The lower wiring structure 60 may include a lower contact plug and lower interconnection lines.

Figure 19:
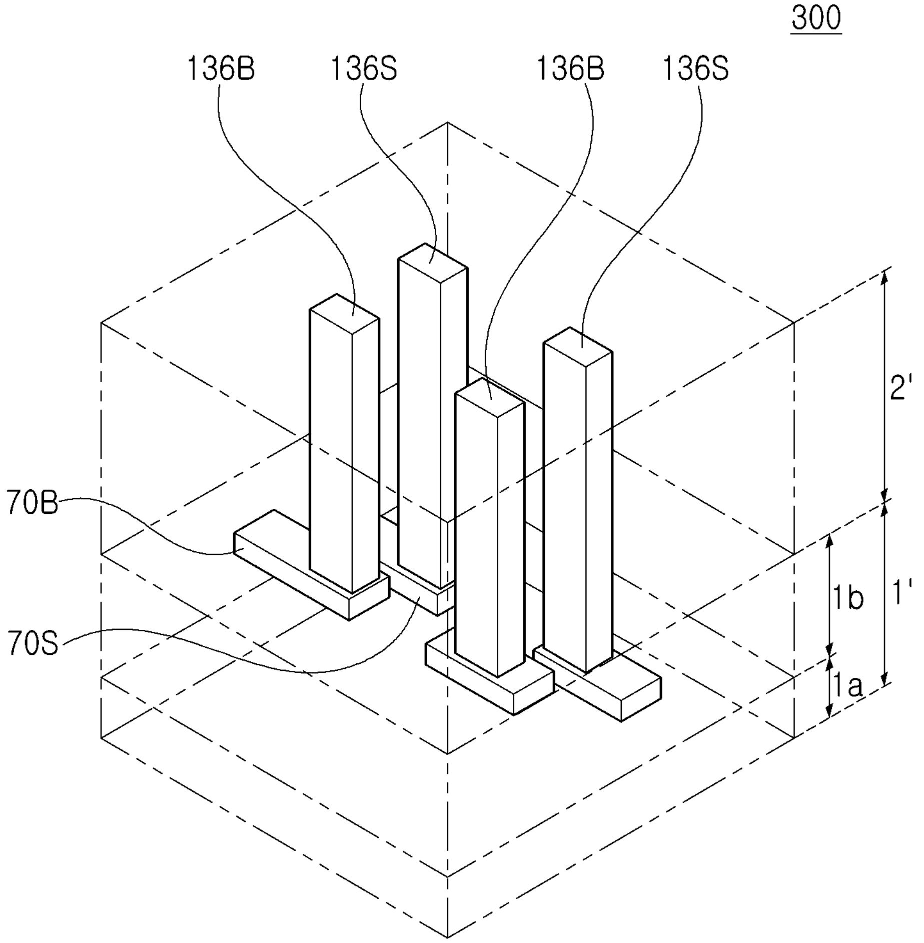
FIG. 19 is a schematic perspective view of a semiconductor device according to an embodiment of the present inventive concept.

FIG. 19 is a schematic perspective view of a semiconductor device according to an embodiment.

Referring to FIG. 19, a semiconductor device 300 may include a first structure 1' and a second structure 2' disposed on the first structure 1' (e.g., in a vertical direction). The first structure 1' may be a peripheral circuit region in which circuit elements for operating memory cells of the second structure 2' are disposed. The second structure 2' may include a structure of the semiconductor device of FIGS. 2 to 7B described above. In an embodiment, the first structure 1' may include an element region 1*a* and a wiring region 1*b* on the element region 1*a*. The element region 1*a* may be a circuit region. For example, the element region 1*a* may include a plurality of transistors. The second structure 2' may include the vertical source line 136S and the vertical bit line 136B, and the vertical source line 136S and the vertical bit line 136B may partially extend into the first structure 1' by penetrating through the bottom of the second structure 2'. For example, the vertical source line 136S may partially extend into the wiring region 1*b* to be connected to a first wiring 70S in the wiring region 1*b*, and the vertical bit line 136B may partially extend into the wiring region 1*b* to be connected to a second wiring 70B in the wiring region 1*b*.

According to embodiments of the present inventive concept, the semiconductor device with the increased electrical properties may be provided by respectively disposing the first conductive layer and the second conductive layer on both of the side surfaces of the ferroelectric layer.

While embodiments of the present inventive concept have been shown and described above, it will be apparent to those skilled in the art that modifications and variations could be made without departing from the scope of the present inventive concept.

What is claimed is:

1. A semiconductor device comprising:

a substrate;

a plurality of horizontal structures stacked on the substrate and spaced apart from each other; and a plurality of vertical structures penetrating through the plurality of horizontal structures, wherein each of the plurality of vertical structures includes a vertical source line, a vertical bit line, a channel layer, and a dielectric layer, the channel layer is in direct contact with the vertical source line and the vertical bit line, the dielectric layer is between the plurality of horizontal structures and the channel layer, and each of the plurality of horizontal structures includes a first conductive layer, a ferroelectric layer surrounding at least a portion of the first conductive layer, and a second conductive layer between the ferroelectric layer and the dielectric layer.

2. The semiconductor device of claim 1, wherein:

the ferroelectric layer has a first surface and a second surface opposite to each other;

the first surface of the ferroelectric layer is in direct contact with the first conductive layer; and the second surface of the ferroelectric layer is in direct contact with the second conductive layer.

3. The semiconductor device of claim 1, wherein the second conductive layer is in direct contact with a side surface of the dielectric layer and is spaced apart from the first conductive layer.

4. The semiconductor device of claim 1, wherein the vertical source line and the vertical bit line horizontally overlap the plurality of horizontal structures.

5. The semiconductor device of claim 1, further comprising:

a plurality of interlayer insulating layers alternately stacked with the plurality of horizontal structures, wherein the ferroelectric layer is in direct contact with the plurality of interlayer insulating layers.

6. The semiconductor device of claim 1, further comprising:

a plurality of interlayer insulating layers alternately stacked with the plurality of horizontal structures, wherein the ferroelectric layer is spaced apart from the plurality of interlayer insulating layers.

7. The semiconductor device of claim 1, wherein:

the ferroelectric layer covers an upper surface, a lower surface and a side surface of the first conductive layer; and the second conductive layer covers an upper surface, a lower surface and a side surface of the ferroelectric layer.

8. The semiconductor device of claim 1, wherein the ferroelectric layer has a first layer and a second layer that are alternately laminated on each other.

9. The semiconductor device of claim 8, wherein:
the first layer includes a first ferroelectric material; and
the second layer includes a second ferroelectric material that is different from the first ferroelectric material.

10. The semiconductor device of claim 8, wherein:
the first layer includes a first ferroelectric material; and
the second layer includes an insulating material that is different from the first ferroelectric material.

11. The semiconductor device of claim 1, wherein:
the vertical source line and the vertical bit line have side surfaces facing each other;
the channel layer is between the vertical source line and the vertical bit line; and
the dielectric layer is in direct contact with the vertical source line and the vertical bit line.

12. The semiconductor device of claim 1, further comprising:
a plurality of interlayer insulating layers alternately stacked with the plurality of horizontal structures;
a plurality of separation line patterns penetrating through the plurality of horizontal structures and the plurality of interlayer insulating layers, and extending in a first direction parallel to an upper surface of the substrate; and
separation insulating patterns penetrating through the plurality of horizontal structures and the plurality of interlayer insulating layers, and disposed between the plurality of vertical structures.

13. The semiconductor device of claim 1, further comprising:
a first wiring disposed on the vertical source line and electrically connected to the vertical source line; and
a second wiring disposed on the vertical bit line and electrically connected to the vertical bit line.

14. A semiconductor device comprising:
a substrate;
a plurality of horizontal structures stacked on the substrate and spaced apart from each other in a vertical direction; and
a plurality of vertical structures penetrating through the plurality of horizontal structures,
wherein each of the plurality of vertical structures includes a vertical conductive line overlapping the plurality of horizontal structures in a horizontal direction, a channel layer on a side surface of the vertical conductive line, and a dielectric layer on a side surface of the channel layer,
each of the plurality of horizontal structures includes a first conductive layer, a ferroelectric layer surrounding at least a portion of the first conductive layer, and a second conductive layer between the ferroelectric layer and the dielectric layer, and
an upper surface of the second conductive layer is coplanar with an upper surface of the ferroelectric layer in the vertical direction.

15. The semiconductor device of claim 14, wherein a lower surface of the second conductive layer is coplanar with a lower surface of the ferroelectric layer in the vertical direction.

16. The semiconductor device of claim 14, wherein:
the ferroelectric layer has a first surface and a second surface opposite to each other,
the first surface of the ferroelectric layer is in direct contact with the first conductive layer; and
the second surface of the ferroelectric layer is in direct contact with the second conductive layer.

17. The semiconductor device of claim 14, wherein:
the first conductive layer has a first thickness in the vertical direction;
the second conductive layer has a second thickness in the horizontal direction; and
the first thickness is greater than the second thickness.

18. A semiconductor device comprising:
a substrate;
a plurality of horizontal structures stacked on the substrate and spaced apart from each other; and
a plurality of vertical structures penetrating through the plurality of horizontal structures,
wherein each of the plurality of vertical structures includes a vertical conductive line overlapping the plurality of horizontal structures in a horizontal direction, a channel layer on a side surface of the vertical conductive line, and a dielectric layer on a side surface of the channel layer, and
each of the plurality of horizontal structures includes a first conductive layer, a ferroelectric layer surrounding at least a portion of the first conductive layer, and a second conductive layer surrounding at least a portion of the ferroelectric layer.

19. The semiconductor device of claim 18, wherein:
the ferroelectric layer surrounds a side surface, an upper surface, and a lower surface of the first conductive layer; and
the second conductive layer surrounds a side surface, an upper surface, and a lower surface of the ferroelectric layer.

20. The semiconductor device of claim 18, wherein:
the first conductive layer has a first thickness in a vertical direction;
the second conductive layer has a second thickness in the horizontal direction; and
the first thickness is greater than the second thickness.

* * * * *